(12) United States Patent
Kai et al.

(10) Patent No.: US 8,710,481 B2
(45) Date of Patent: Apr. 29, 2014

(54) NON-VOLATILE MEMORY CELL CONTAINING A NANO-RAIL ELECTRODE

(75) Inventors: James K. Kai, Santa Clara, CA (US); Henry Chien, San Jose, CA (US); George Matamis, Danville, CA (US); Vinod R. Purayath, Santa Clara, CA (US)

(73) Assignee: SanDisk 3D LLC, Milpitas, CA (US)

( * ) Notice: Subject to any disclaimer, the term of this patent is extended or adjusted under 35 U.S.C. 154(b) by 81 days.

(21) Appl. No.: 13/356,047

(22) Filed: Jan. 23, 2012

(65) Prior Publication Data

US 2013/0187114 A1 Jul. 25, 2013

(51) Int. Cl.
*H01L 47/00* (2006.01)

(52) U.S. Cl.
USPC .... 257/3; 257/1; 257/E21.602; 257/E45.002; 257/E45.003

(58) Field of Classification Search
USPC ........... 257/1, 3, E21.602, E45.002, E45.003; 977/773, 775, 890
See application file for complete search history.

(56) References Cited

U.S. PATENT DOCUMENTS

| | | | |
|---|---|---|---|
| 6,015,738 A | 1/2000 | Levy et al. | |
| 8,053,751 B2* | 11/2011 | Kim et al. | 257/2 |
| 8,097,498 B2 | 1/2012 | Purayath et al. | |
| 2005/0052915 A1 | 3/2005 | Herner et al. | |
| 2005/0073010 A1 | 4/2005 | Lai et al. | |
| 2005/0098800 A1* | 5/2005 | Herner et al. | 257/209 |
| 2006/0246606 A1 | 11/2006 | Hsu et al. | |
| 2006/0292301 A1 | 12/2006 | Herner | |
| 2007/0072360 A1 | 3/2007 | Kumar et al. | |
| 2007/0086235 A1* | 4/2007 | Kim et al. | 365/163 |
| 2007/0285962 A1* | 12/2007 | Yen et al. | 365/129 |
| 2008/0068879 A1* | 3/2008 | Ahn et al. | 365/163 |
| 2008/0254576 A1 | 10/2008 | Hsia et al. | |
| 2009/0179310 A1 | 7/2009 | Dunton et al. | |
| 2009/0256129 A1 | 10/2009 | Scheuerlein | |
| 2011/0062557 A1* | 3/2011 | Bandyopadhyay et al. | 257/616 |
| 2011/0136327 A1* | 6/2011 | Han et al. | 438/488 |
| 2011/0183475 A1 | 7/2011 | Purayath et al. | |
| 2012/0149165 A1* | 6/2012 | Park et al. | 438/382 |

FOREIGN PATENT DOCUMENTS

WO 2009/091786 A1 7/2009

OTHER PUBLICATIONS

U.S. Appl. No. 11/015,824, filed Dec. 17, 2004, Herner et al.
U.S. Appl. No. 11/819,078, filed Jul. 25, 2007, Herner et al.
U.S. Appl. No. 12/007,780, filed Jan. 15, 2008, Herner et al.
U.S. Appl. No. 12/216,924, filed Jul. 11, 2008, Ping et al.
International Searching Authority: European Patent Office (ISA/EP). International Search Report and Written Opinion, PCT Application PCT/US2011/022400. Apr. 8, 2011.
Im, D.H., et al., "A Unified 7.5nm Dash-Type Confined Cell for High Performance PRAM Device", IEEE Electron Devices Meeting, Dec. 15-17, 2008, pp. 1-4.

(Continued)

*Primary Examiner* — David S Blum
(74) *Attorney, Agent, or Firm* — The Marbury Law Group PLLC

(57) ABSTRACT

A non-volatile memory device includes a plurality of non-volatile memory cells. Each of the non-volatile memory cells includes a first electrode, a diode steering element, a storage element located in series with the diode steering element, a second electrode, and a nano-rail electrode having a width of 15 nm or less.

9 Claims, 18 Drawing Sheets

(56) References Cited

OTHER PUBLICATIONS

Kim, M.J., et al., "Low Power Operating Bipolar TMO ReRAM for Sub 10 nm Era", IEEE Electron Devices Meeting, Dec. 6-8, 2010, pp. 19.3.1-19.3.4.

Article, IBM Research—Zurich News, "IBM Scientists Demonstrate Computer Memory Breakthrough", Jun. 30, 2011, p. 1-2.

Dennison, Chuck, "Phase Change Memory: Status and Challenges to Navigate an Increasingly Competitive Memory Landscape", Ovonyx, Inc., Oct. 14, 2009, pp. 1-58.

* cited by examiner

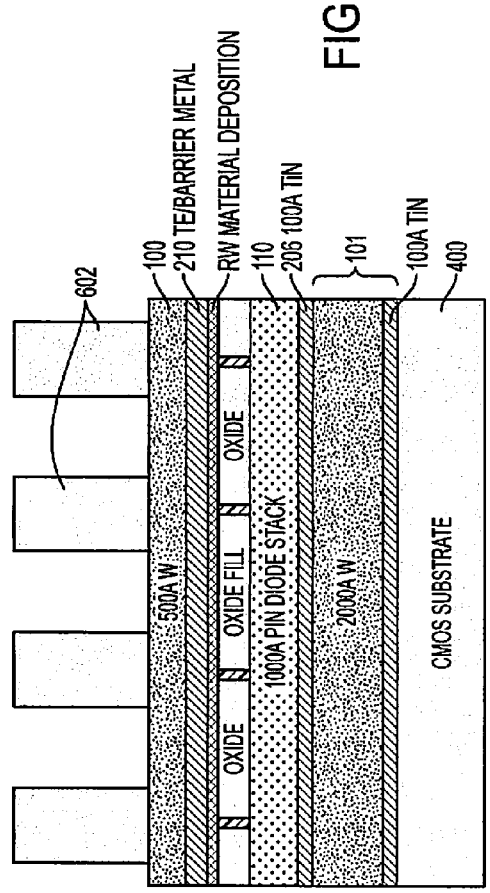
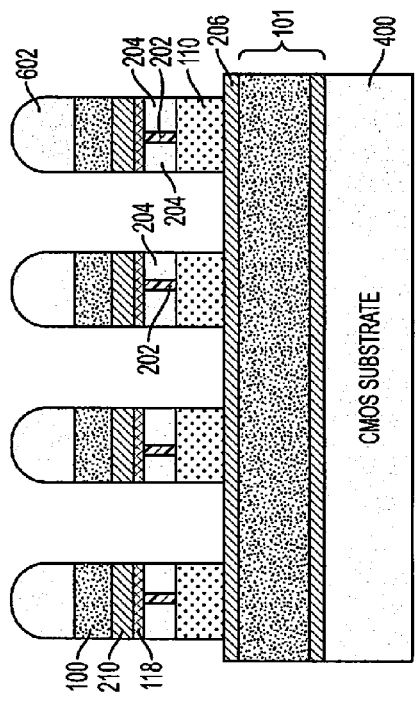

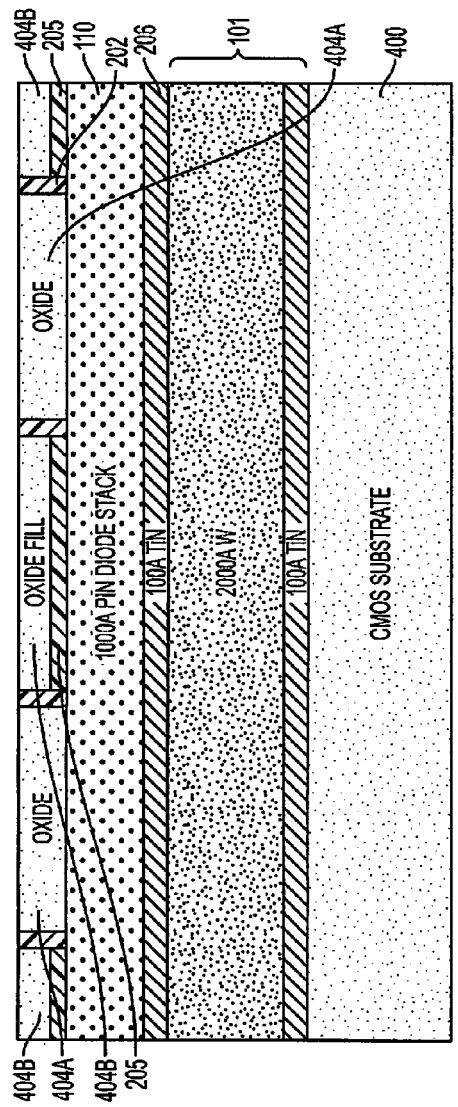
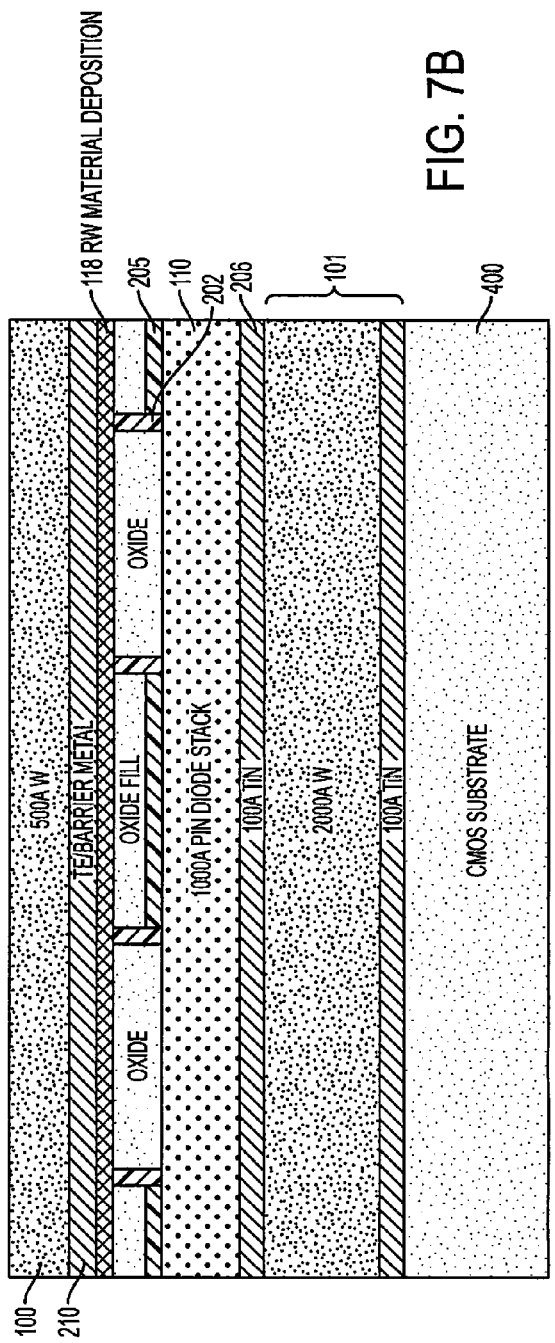

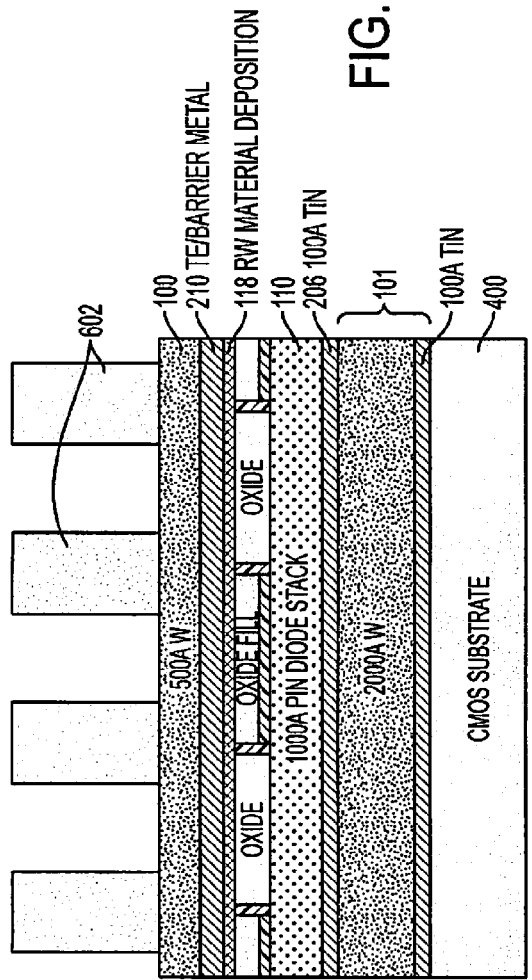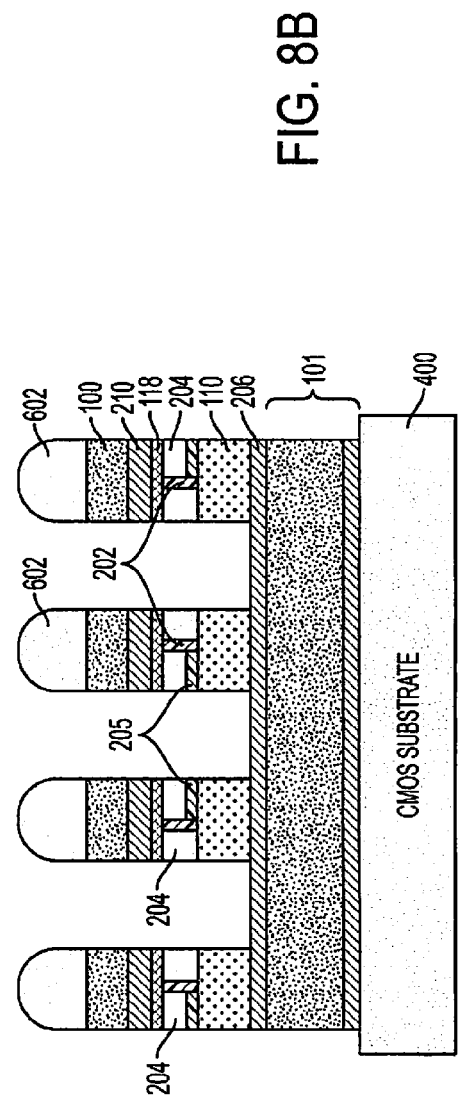

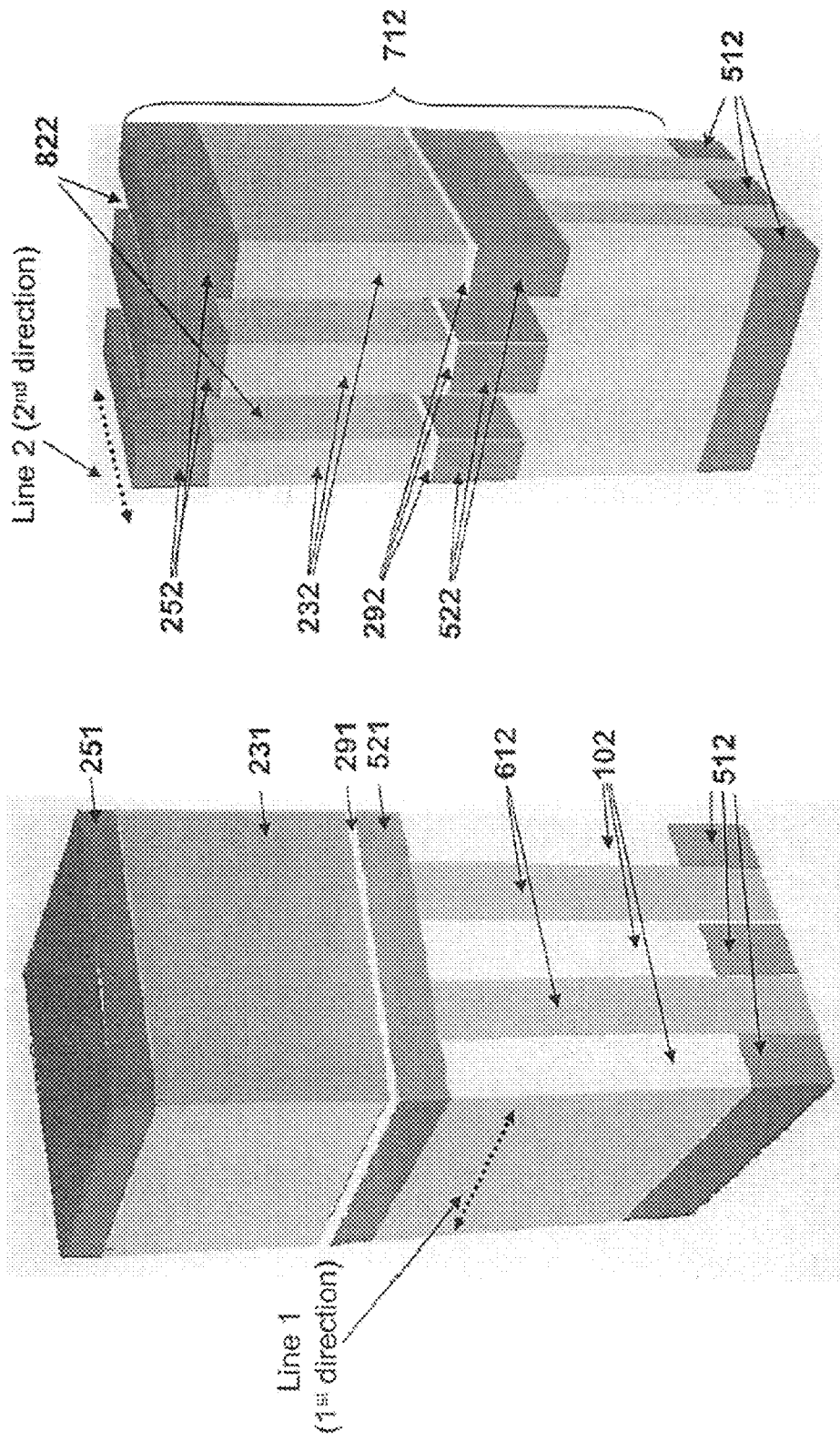

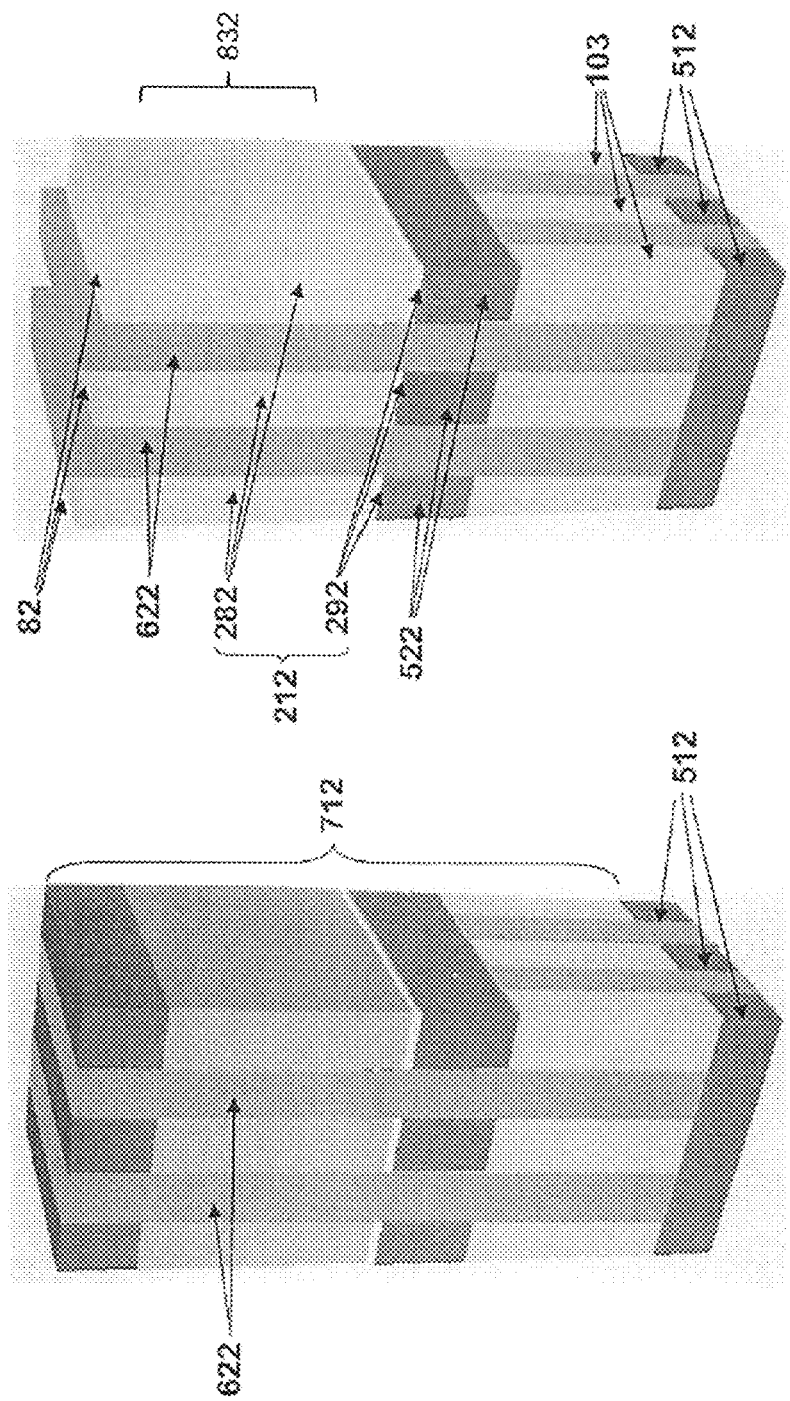

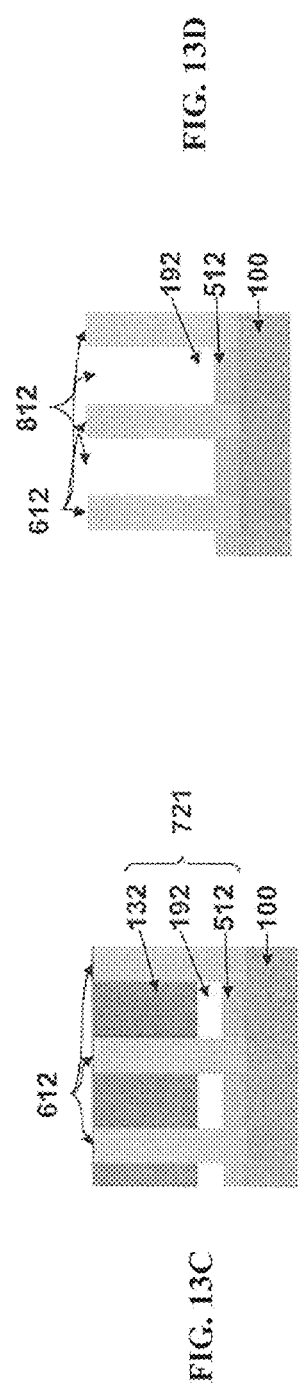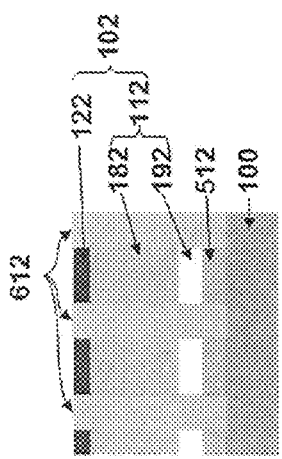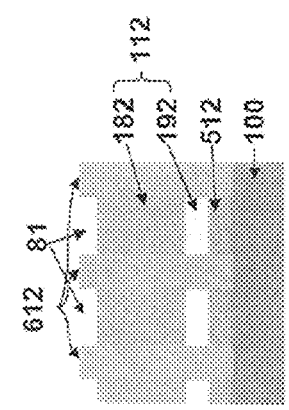

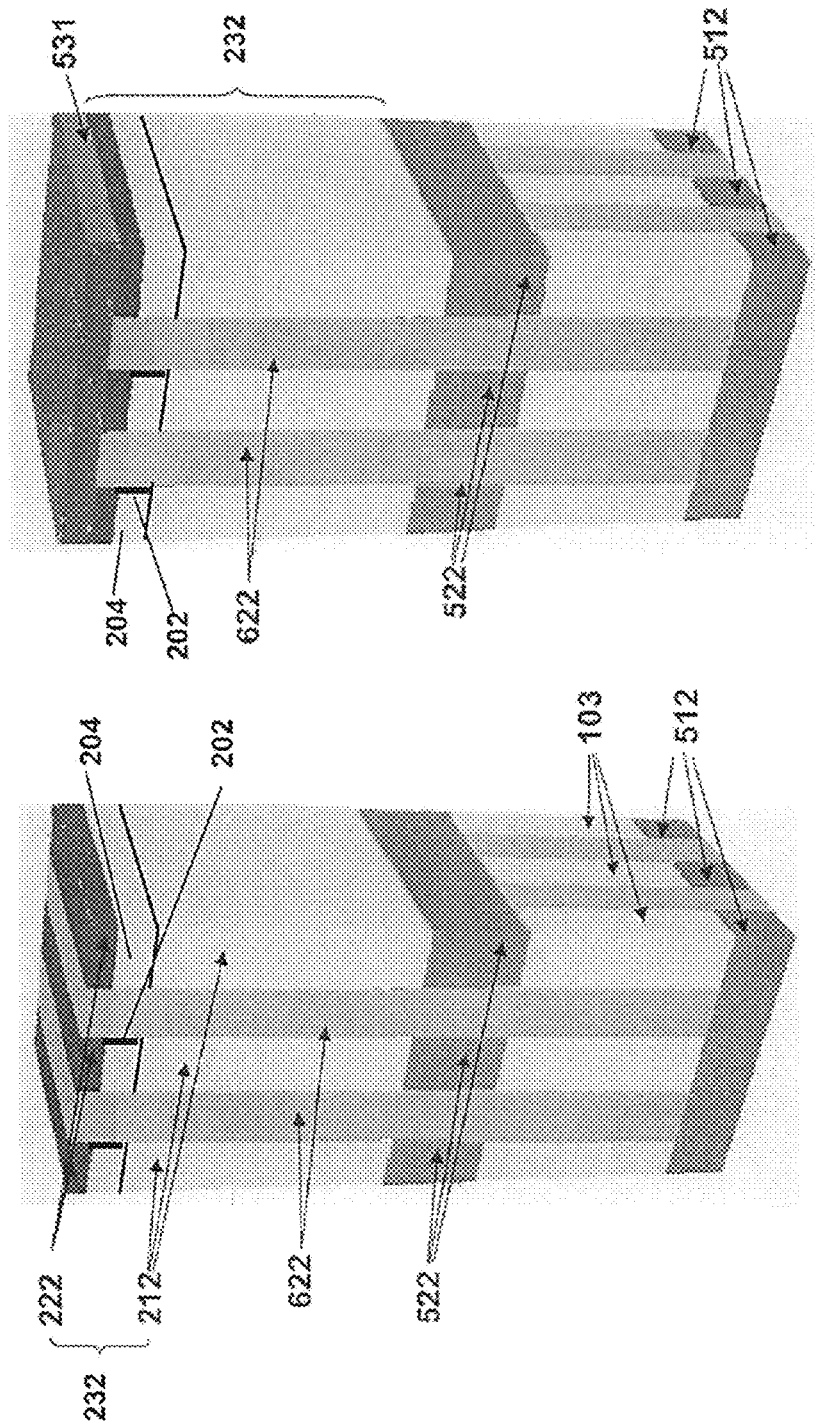

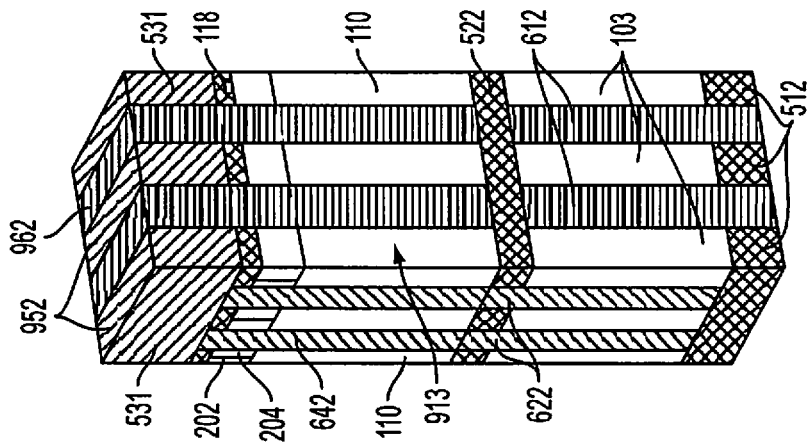
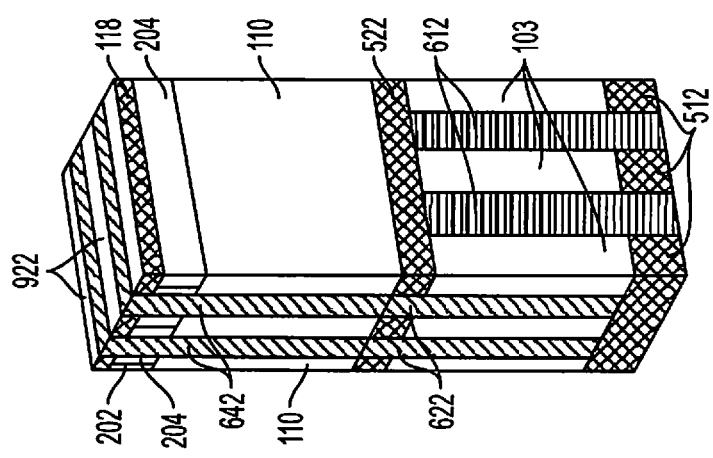
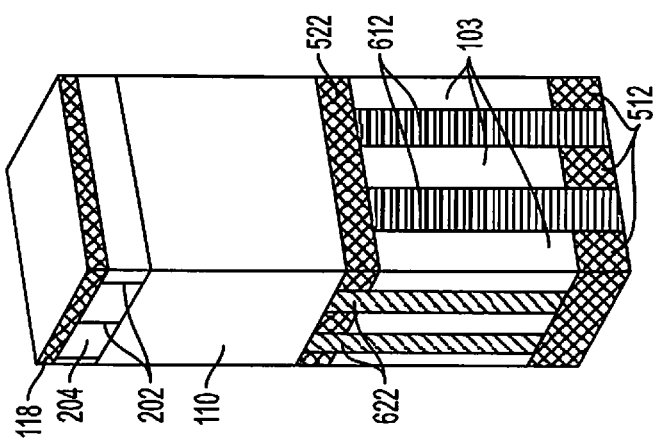

NON-VOLATILE MEMORY CELL CONTAINING A NANO-RAIL ELECTRODE

BACKGROUND OF THE INVENTION

The invention relates to non-volatile memory devices and methods of making thereof.

Non-volatile memory arrays maintain their data even when power to the device is turned off. In one-time programmable arrays, each memory cell is formed in an initial unprogrammed state, and can be converted to a programmed state. This change is permanent, and such cells are not erasable. In other types of memories, the memory cells are erasable, and can be rewritten many times.

Cells may also vary in the number of data states each cell can achieve. A data state may be stored by altering some characteristic of the cell which can be detected, such as current flowing through the cell under a given applied voltage or the threshold voltage of a transistor within the cell. A data state is a distinct value of the cell, such as a data '0' or a data '1'.

SUMMARY OF THE EMBODIMENTS

One embodiment of the invention provides a non-volatile memory device includes a plurality of non-volatile memory cells. Each of the non-volatile memory cells includes a first electrode, a diode steering element, a storage element located in series with the diode steering element, a second electrode, and a nano-rail electrode having a width of 15 nm or less.

Another embodiment of the invention provides a method of making a non-volatile memory cell, comprising forming a first electrode, forming a diode steering element, forming a first feature, forming an electrically conductive layer over the first feature such that at least a portion of the electrically conductive layer on a sidewall of the first feature forms a nano-rail electrode having a width of 15 nm or less, forming a storage element, and forming a second electrode.

Another embodiment of the invention provides a method of making a semiconductor device, comprising providing a first device level comprising a plurality of first rails, wherein each first rail comprises a first conductor rail, a first semiconductor rail located over the first conductor rail, and a nano-rail electrode having a width of 15 nm or less, the first rails are separated by first insulating features, and the first rails extend in a first direction, forming a second conductor layer over the first device level, patterning the second conductor layer, the nano-rail electrode and the first semiconductor rails in the first rails to form a plurality of second rails extending in a second direction different from the first direction, and forming second insulating features between the second rails.

BRIEF DESCRIPTION OF THE DRAWINGS

FIGS. 4A-4B, 5A-5B and 6A-6B are side cross-sectional views schematically illustrating a method of making non-volatile memory cells of embodiments of the invention.

FIGS. 7A-7B and 8A-8B are side cross-sectional views schematically illustrating another method of making non-volatile memory cells of embodiments of the invention.

FIGS. 11A to 11G are three dimensional ("3D") schematic drawings illustrating stages in formation of a device having at least two device levels according to one embodiment.

FIGS. 13A to 13F are side cross-sectional views illustrating stages in formation of a first device level according to one embodiment.

FIGS. 16A to 16C are side cross-sectional views illustrating stages in formation of the device levels according to an alternative embodiment.

FIGS. 17A to 17C are side cross-sectional views illustrating stages in formation of the device levels according to an alternative embodiment.

DETAILED DESCRIPTION OF THE PREFERRED EMBODIMENTS

Figure 1:
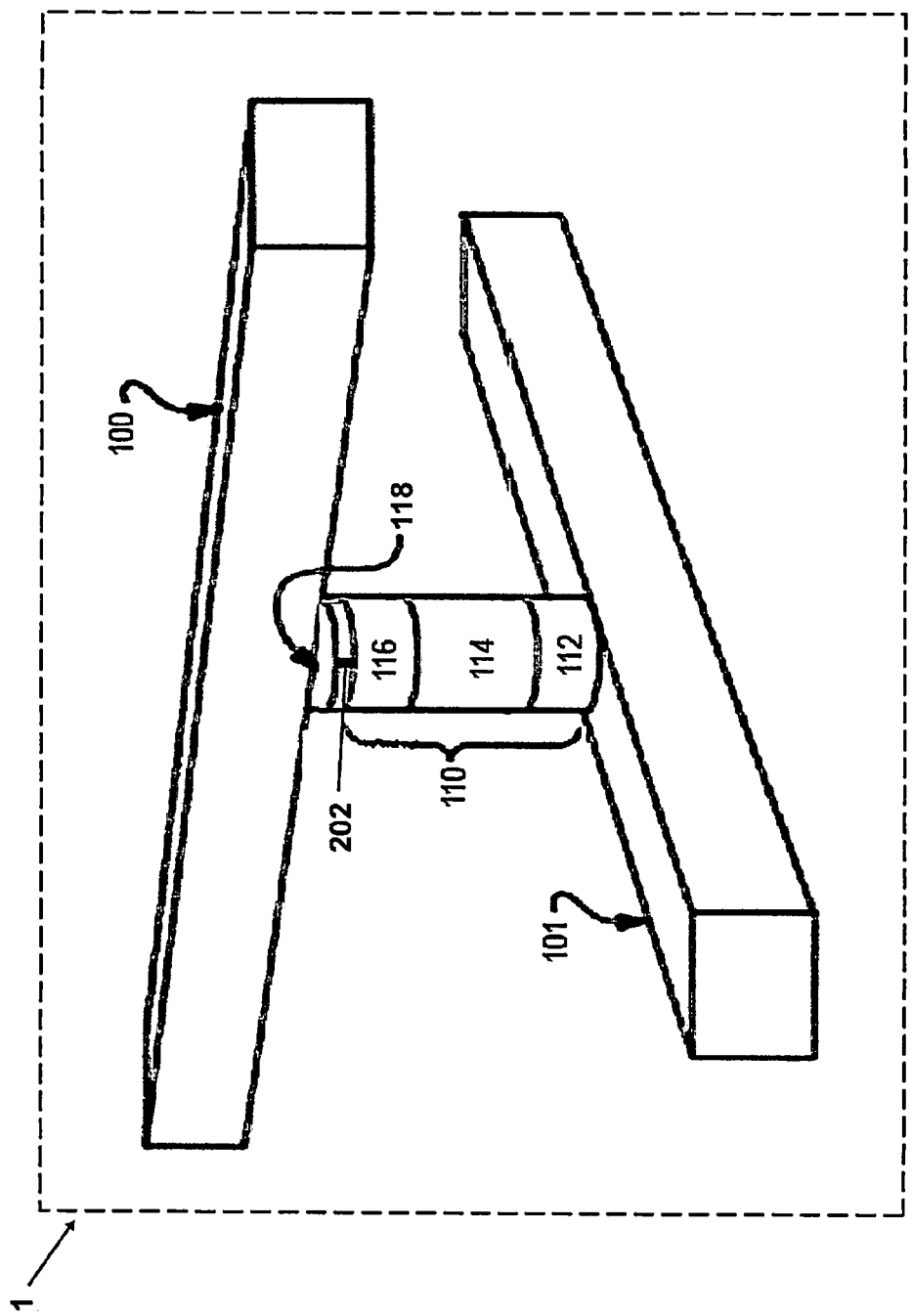
FIG. 1 is a perspective view of a non-volatile memory cell of one embodiment of the invention.

In general, a memory cell comprises a storage element and a steering element. For example, FIG. 1 illustrates a perspective view of a memory cell 1 of one embodiment.

The cell 1 includes a first electrode 101 and a second electrode 100 are formed of a conductive material, which can independently comprise any one or more suitable conducting material known in the art, such as tungsten, copper, aluminum, tantalum, titanium, cobalt, titanium nitride or alloys thereof. For example, in some embodiments, tungsten is preferred to allow processing under a relatively high temperature. In some other embodiments, copper or aluminum is a preferred material. The first electrode 101 (e.g., word line) extends in a first direction while the second electrode 100 (e.g., bit line) extends in a second direction different from the first direction. Barrier and adhesion layers, such as TiN layers, may be included in the first (e.g., the bottom) electrode 101 and/or the second (e.g., the top) electrode 100.

The steering element 110 can be a transistor or a diode. If the steering element 110 is a diode, the storage element can be arranged vertically and/or horizontally and/or patterned to form a pillar or block having a substantially cylindrical shape. In one embodiment, as shown in FIG. 1, the steering element 110 is a semiconductor diode arranged vertically and having a bottom heavily doped p-type region 112, an optional intrinsic region 114, which is not intentionally doped, and a top heavily doped n-type region 116, though the orientation of this diode may be reversed. Such a diode, regardless of its orientation, will be referred to as a p-i-n diode or simply diode. The diode can comprise any single crystal, polycrystalline, or amorphous semiconductor material, for example silicon, germanium, silicon germanium, or other compound semiconductor materials, such as III-V, II-VI, etc. materials. For example, a p-i-n polysilicon diode 110 may be used.

A storage element 118 is disposed in series with the steering element 110, either over the top region 116 or below the bottom region 112 of the steering element 110. The storage element 118 may be a resistivity switching element. For example, the storage element may comprise a metal oxide switchable material layer selected from NiO, $Nb_2O_5$, $TiO_2$, $HfO_2$, $Al_2O_3$, $MgO_x$, $CrO_2$, VO or combination thereof. Other materials suitable for the resistivity switching element 118 include but are not limited to phase change materials (e.g., chalcogenide materials), doped polycrystalline silicon, carbon materials (e.g., carbon nanotubes, graphene, amorphous carbon, polycrystalline carbon, etc.), complex metal oxide materials, conductive bridge elements, or switchable polymer materials.

In one embodiment of the invention, a nano-rail electrode 202 having a width of 15 nm or less is located in series with the steering element 110 and the metal oxide storage element 118 between the top electrode 100 and the bottom electrode 101. Preferably, the nano-rail electrode is located in the pillar shaped memory cell 1 between the storage element 118 and the diode the storage element 110. The storage element 118 may be located above or below the diode 110 between the electrodes 100, 101 in the cell 1.

Without wishing to be bound by a particular theory, it is believed that the nano-rail electrode 202 allows the series resistance of the memory cell 1 to be tuned to a desired value by the dimensions (e.g., width and height) of the nano-rail electrode 202. The electrode 202 also reduces the contact area of the ReRAM cell 1 (e.g., the contact area for the storage element 118) and limits the ReRAM cell 1 current.

Without wishing to be bound by a particular theory, it is believed that at least one electrically conductive filament (and typically plural filaments) are formed through the metal oxide storage element or layer(s) 118 during a forming programming of the memory cell to switch the metal oxide storage element from its initial, as-formed, higher resistivity state to a lower resistivity state. After the initial forming programming step, the memory cell may be read and/or further programmed. For example, reset programming voltage or current may be applied to the memory cell between the upper 100 and lower 101 electrodes to switch the metal oxide storage element 118 from the lower resistivity state (e.g., the post-forming state or a "set" state) to a higher resistivity state (e.g., "reset" state). It is believed that the at least one electrically conductive filament no longer extends through the entire metal oxide storage element. In other words, the tip of the filament ends somewhere in the metal oxide element or layer (s) 118 and the filament does not extend to the next electrically conductive layer or doped semiconductor layer of the cell. In another example, a set programming voltage or current is applied to the memory cell between the electrodes 100, 101 to switch the metal oxide storage element from the higher "reset" resistivity state to the lower "set" resistivity state. It is believed that the set programming pulse causes the electrically conductive filament to extend through the entire metal oxide storage element (e.g., the filament grows longer to span the entire metal oxide element or layer 118 thickness).

Preferably, the forming programming step comprises applying a forward bias (e.g., positive voltage) to flow a direct current between the electrodes 100, 101. Preferably, the set programming step comprises applying a negative voltage (e.g., reverse bias) between the electrodes to flow an alternating current through the memory cell, and the reset programming step comprises applying a positive voltage (e.g., a forward bias) between the electrodes to flow an alternating current through the memory cell. Thus, the memory cell 1 is preferably a rewritable memory cell, and is located in a memory device which comprises a monolithic three dimensional array of the memory cells. Additional memory levels can be formed above or below the memory level described above to form the monolithic three dimensional memory array having more than one device level, as will be described below.

Figure 2A:
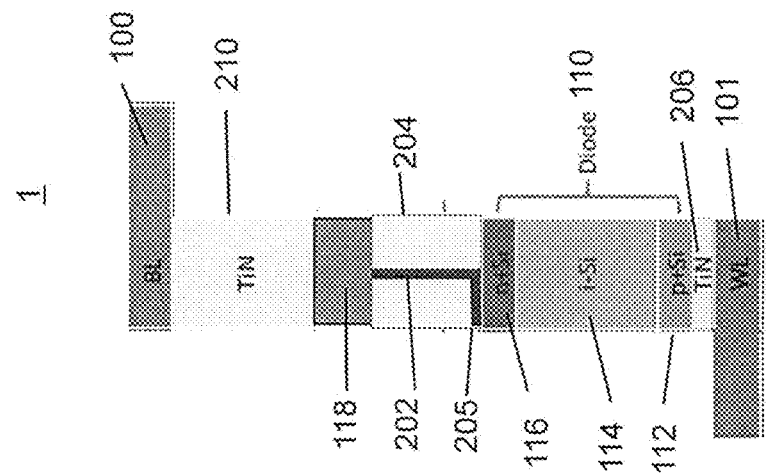
FIGS. 2A and 2B are side cross-sectional views schematically illustrating non-volatile memory cells of embodiments of the invention.
Figure 2B:
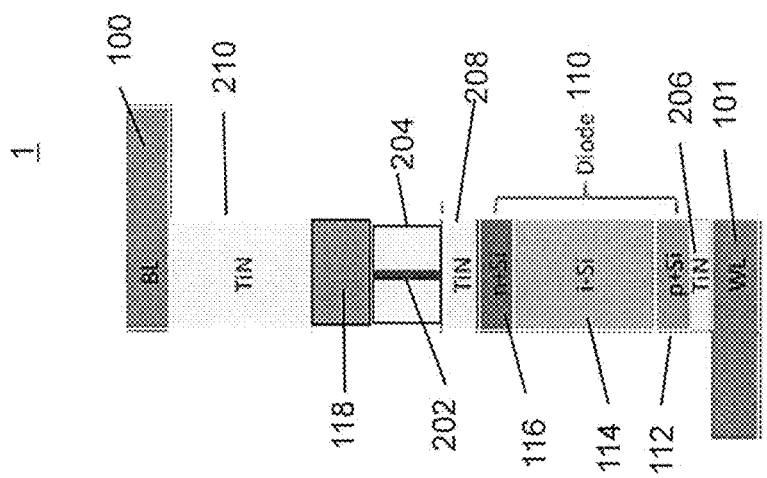

FIGS. 2A and 2B are side cross-sectional views schematically illustrating non-volatile memory cells of embodiments of the invention. For example, as shown in FIG. 2A, the memory cell 1 may include the storage element 118 located above the diode 110. The diode 110 may include the p+ semiconductor layer 112, the intrinsic semiconductor layer 114 and the n+ semiconductor layer 116 formed over the bottom electrode 101 (e.g., word line) in that order. Preferably, the nano-rail electrode 202 is located in the pillar shaped memory cell 1 between the storage element 118 and the diode the storage element 110, as shown in FIGS. 2A and 2B.

The memory cell may also include one or more optional conductive barrier layers 206, 208 and 210, such as titanium nitride or other similar layers. These barrier layers 206, 208 and 210 may be disposed between the bottom electrode 101 and the diode 110, and/or between the diode 110 and the nano-electrode 202/storage element 118 and/or between the storage element 118 and the upper electrode 100, respectively, as shown in FIG. 2A. Alternatively, the barrier layer(s) may be omitted. For example, as shown in FIG. 2B, the middle barrier layer 208 is omitted.

Preferably a bottom of the nano-rail electrode 202 is located in electrical contact with an upper surface (e.g., region 116) of the diode 110, while a top of the nano-rail electrode 202 is located in electrical contact with a lower surface of the storage element 118. The bottom electrode 101 is located in electrical contact with a lower surface of the diode 110 and the upper electrode 100 is located in electrical contact with an upper surface of the storage element 118. As used herein, the term electrical contact includes direct or indirect physical contact. For example, the top of the nano-rail electrode 202 may be located in direct physical contact with a lower surface of the storage element 118. The bottom of the nano-rail electrode 202 is located in indirect or direct physical contact with an upper surface of the diode 110 in FIGS. 2A and 2B, respectively.

If desired, the nano-rail electrode may also include an optional horizontal portion 205 which extends parallel to the top surface of the underlying layer of the device. The horizontal portion 205 may contact the side of the bottom end of the electrode 202. The portion 205 is formed as a remnant of one fabrication process described below.

In some embodiments, an electrically insulating material 204 is located adjacent to first and second sides of the nano-rail electrode 202 between the lower surface of the storage element 118 and the upper surface of the diode 110. In other words, the electrode 202 is preferably embedded in the insulating material 204 such that the top and bottom sides of the electrode 202 electrically contact the adjacent element 118 and diode 110, respectively. Any suitable insulating material 204 may be used, such as silicon oxide, silicon nitride, silicon oxynitride, alumina, zirconia, or organic insulating materials (e.g., polymers, etc.).

Figure 3:
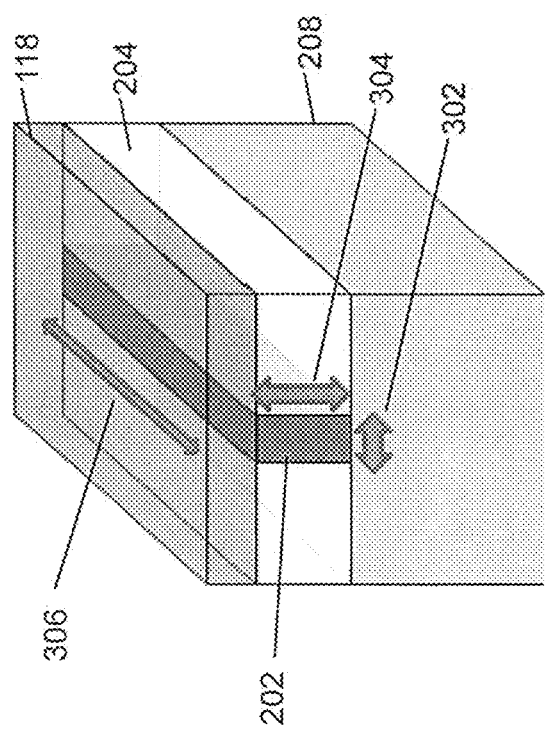
FIG. 3 is a perspective view of a nano-rail electrode of one embodiment of the invention.

As shown in FIG. 3, the nano-rail electrode 202 preferably has a width 302 of 2-15 nm, such as 9-11 nm, a height 304 (extending the pillar stacking direction) of 10-100 nm, such as 20-40 nm, and length 306 of 10-100 nm, such as 40-60 nm. Thus, the width 302 (extending in one direction perpendicular to the pillar stacking direction) is smaller than the length 306 (extending in another direction perpendicular to the width and perpendicular to the pillar stacking direction) by at least 50%, such as by 100 to 1000%. The pillar diameter or length approximately equals the electrode 202 length 306. The nano-rail electrode 202 may comprise any suitable electrically conductive material, such as doped polysilicon, metal or metal alloy which acts as a series resistor which reduces a current in the memory cell. For example, the electrode 202 may be made of titanium nitride or doped polysilicon.

In the above described configuration, the nano-rail electrode 202 is located between the diode 110 and the storage element 118. However, other alternative configurations (not shown) may also be formed, for example where the nano-rail electrode 202 is located in the memory cell 1 between one of the top 100 or bottom 101 electrode and one of the storage element 118 or the diode 110, such that the nano-rail electrode 202 provides an electrical connection between the one of the electrodes 100, 101 and one of the storage element 118 or the diode 110. Thus, the nano-rail electrode 202 may be located between the top electrode 100 and the storage element 118 such that the nano-rail electrode 202 provides an electrical connection between the electrode 100 and the storage element 118. Alternatively, the nano-rail electrode 202 may be located between the bottom electrode 101 and the diode 110, such that the nano-rail electrode 202 provides an electrical connection between the electrode 101 and the diode 110.

In one embodiment, the memory cell 1 includes a cylindrical vertical pillar containing steering element 110, storage element 118 and electrode 202, as shown in FIG. 1. However, the steering element 110, storage element 118 and electrode 202 may be located in a pillar having another cross sectional shape, such as a square or rectangular cross section shape when viewed from above, as will be described in more detail below. Furthermore, as will be described in more detail below, the electrodes 100, 101 comprise conductor rails, and an insulating material is located adjacent to opposing first and second sides of the memory cell, and extends between adjacent first electrode conductor rails. The insulating material is also located adjacent to opposing third and fourth sides of the memory cell, and extends between adjacent second electrode conductor rails, as will be described below.

Figure 4A:
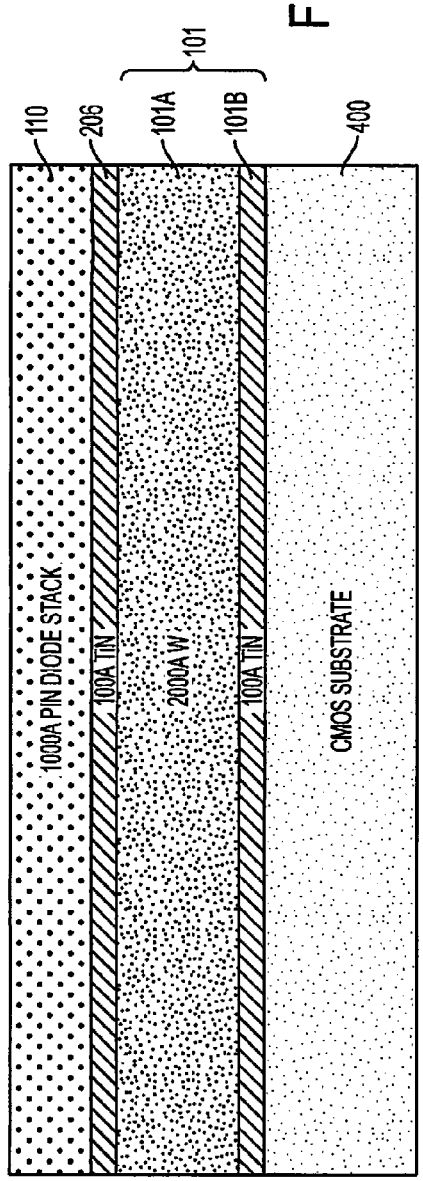

FIGS. 4-6 illustrate a first embodiment method of making the memory device with the nano-rail electrode. As shown in FIG. 4A, the bottom electrode 101 is formed over a substrate 400. The substrate 400 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as glass, plastic, metal or ceramic substrate. The substrate may include integrated circuits fabricated thereon, such as driver circuits for a memory device (e.g., a CMOS circuit containing substrate). An insulating layer (not shown) is preferably formed over substrate. The insulating layer can be silicon oxide, silicon nitride, silicon oxynitride, high-dielectric constant film (e.g., alumina, zirconia, etc.), Si—C—O—H film, organic dielectric material or any other suitable insulating material. The bottom electrode 101 may comprise a metal rail 101A, such as 100-300 nm, for example, an about 200 nm tungsten rail located over a 5-20 nm, such as an about 10 nm TiN barrier/adhesion layer 101B.

The optional barrier layer 206, such as 5-20 nm, such as an about 10 nm TiN barrier layer, is formed over the bottom electrode 101. The diode steering element 110 is then formed over the barrier layer 206. The diode 110 may comprise the p-i-n diode shown in FIGS. 2A and 2B and may have a thickness of 50 to 200 nm, such as about 100 nm. Alternatively, other steering elements, such as transistors, may be used.

Figure 4B:
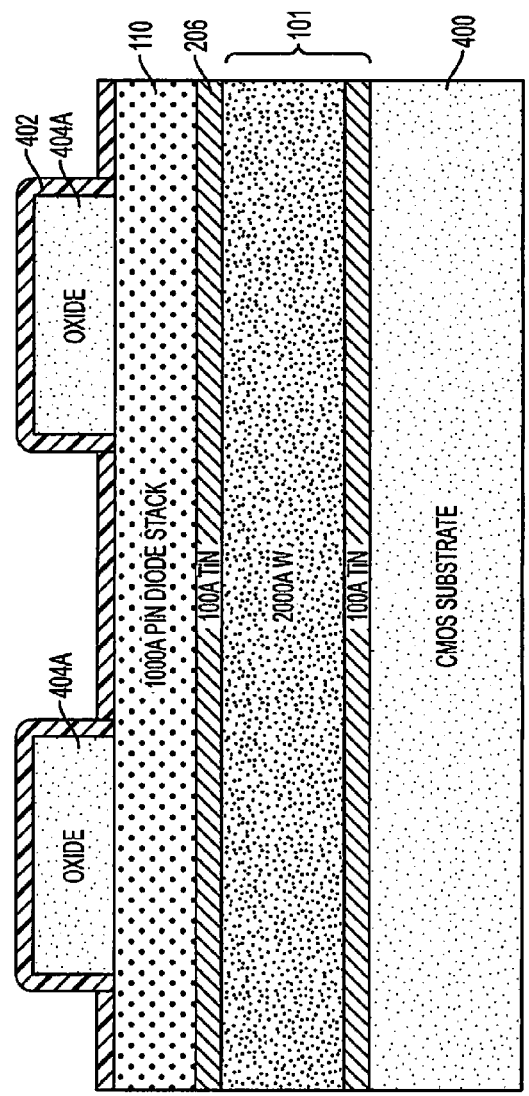

Then, as shown in FIG. 4B, at least one feature 404A is formed over the diode 110. The feature 404A may comprise a mandrel or another similar feature which contains sidewall(s). For example, the feature 404A may comprise a rail shaped mandrel (e.g., which extends in and out of the page in FIG. 4B) made of any suitable electrically insulating material, such as silicon oxide, silicon nitride, silicon oxynitride, high-dielectric constant film (e.g., alumina, zirconia, etc.), Si—C—O—H film, organic dielectric material or any other suitable insulating material.

Preferably, a plurality of spaced apart features 404A are formed over the diode 110. The features 404A may be spaced apart by the width of the each feature. For example, if each feature is 10-30 nm wide, such as 15-20 nm wide, then the space between adjacent features may also be 10-30 nm wide, such as 15-20 nm wide. The features 404A may be formed by any suitable photolithography and etching steps.

An electrically conductive layer 402 is then formed over the features 404A such that at least a portion of the electrically conductive layer on sidewalls of the features 404A forms the nano-rail electrode 202 having a width of 15 nm or less. Thus, it is preferred that layer 402 has a thickness of 15 nm or less, such as 2-15 nm, for example 9-11 nm. The thickness and resistivity of layer 402 determines the width and resistivity of the electrode 202. The thickness of layer 402 also determines the contact area of the MIM subcell comprised of the electrode 202, storage element 118 and upper electrode 100/barrier 210. Layer 402 may be a doped polysilicon layer (e.g., p-type or n-type polysilicon layer) having a dopant concentration of $1 \times 10^{17}$ to $1 \times 10^{22}$ $cm^{-3}$. In this case, the doping concentration of layer 402 also determines the resistivity of the electrode 202. Alternatively, layer 402 may be a metal or metal alloy, such as TiN.

Figure 5A:
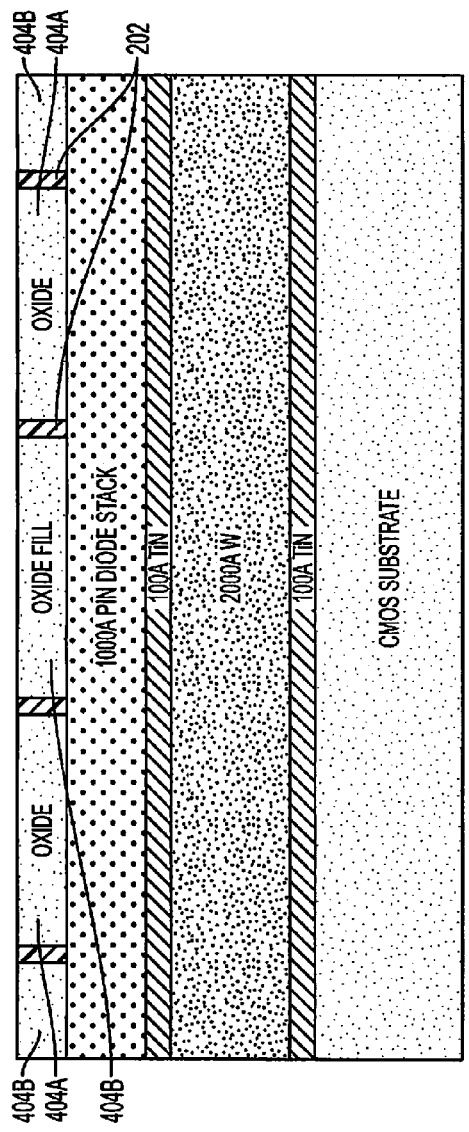

As shown in FIG. 5A, the electrically conductive layer 402 is anisotropically etched to form sidewall spacers 202 on the sidewalls of the features 404A. Thus, each nano-rail electrode comprises the sidewall spacer 202 on a feature 404A and each feature 404A is located adjacent to one side of a given spacer 202. Any suitable anisotropic sidewall spacer etch may be used to form the spacers 202.

Following the electrode 202 formation, an insulating fill layer 404B is formed over the nano-rail electrodes 202 and over the insulating features 404A. The insulating fill layer 404 is then planarized such that it remains adjacent to the exposed side of the nano-rail electrodes 202, and an upper surface of the nano-rail electrodes 202 is exposed between the insulating features 404A and the planarized insulating fill layer 404B as shown in FIG. 5A. Any suitable planarization method may be used, such as chemical mechanical polishing ("CMP") or etchback. The insulating fill layer 404B may comprise any electrically insulating layer and is preferably the same material as the material of the features 404A (e.g., silicon oxide, silicon nitride, silicon oxynitride, high-dielectric constant film (e.g., alumina, zirconia, etc.), Si—C—O—H film, organic dielectric material or any other suitable insulating material).

Figure 5B:
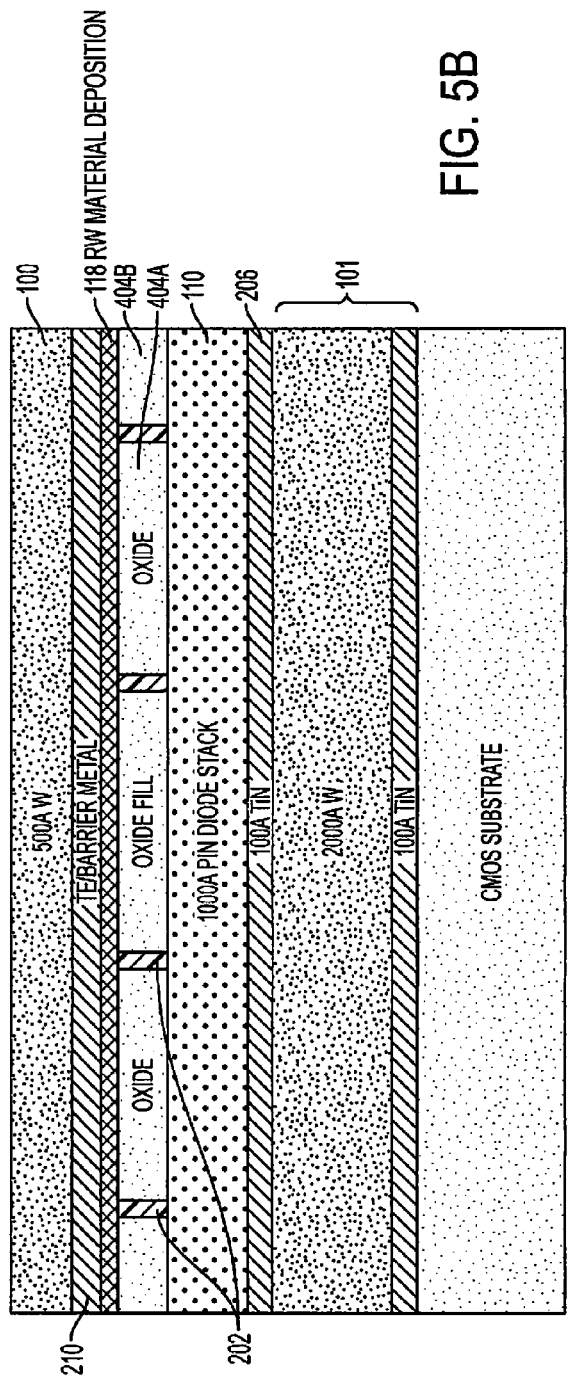

Then, as shown in FIG. 5B, the storage element 118 is formed on the planarized surface comprising exposed upper surfaces of the features 404A, the upper surfaces of the remaining planarized insulating fill layer 404B portions and the upper surfaces of the electrodes 202 embedded between the features 404A and the fill layer portions 404B. The storage element 118 may be formed as one or more metal oxide layers having a thickness of 25 nm or less, such as 2-10 nm by any suitable deposition method (e.g., CVD, ALD, sputtering, etc.). The upper TiN barrier 210 and the top electrode 100 are then formed over the storage element 118. The top electrode 100 may comprise a metal layer, such as 25-100 nm, for example, an about 50 nm tungsten layer, located over a 5-20 nm, such as an about 10 nm TiN barrier layer 210.

A mask pattern 602 is then formed over the top electrode 100, as shown in FIG. 6A. The mask pattern may comprise a photoresist pattern or a hard mask pattern (e.g., silicon oxynitride, silicon oxide, silicon oxynitride and/or amorphous carbon layers). The hard mask pattern 602 may be formed by a sidewall spacer process, where the hard mask layer(s) are formed on spaced apart sacrificial features, followed by an anisotropic sidewall spacer etch of the hard mask layer(s) to form hard mask sidewall spacers, followed by removal of the sacrificial features.

The mask pattern 602 is used as a mask to etch the underlying top electrode 100, the barrier 210, the storage element 118, features 404A/fill layer portions 404B and the diode 110 to form rails which extend in and out of the page, as shown in FIG. 6B. The etched features 404A/fill layer portions 404B form the insulating material 204 in which the electrodes 202 are embedded, as shown in FIGS. 2A, 2B and 6B. The etch preferably stops on the lower barrier 206 such that the barrier 206 and the lower electrode 101 remain as rails which extend perpendicular to the rails containing the diode and the top electrode. The mask pattern is then removed or retained in the device as needed.

In an alternative embodiment, the mask pattern 602 may be formed over the storage material 118 prior to formation of the barrier 210 and top electrode 100 layers. The mask pattern is then used to etch the storage element 118, features 404A/fill layer portions 404B and the diode 110 to form pillars. The mask pattern 602 is then removed, and an insulating fill layer is then formed between adjacent pillars and planarized. The barrier 210 and top electrode 100 layers are then formed over the pillars and the planarized insulating fill layer and then patterned by lithography and etching into rails which extend in an out of the page in FIG. 6B.

In another alternative embodiment, the mask pattern 602 may be formed over the storage material 118 prior to formation of the barrier 210 and top electrode 100 layers. The mask pattern is then used to etch the storage element 118, features 404A/fill layer portions 404B, the diode 110, the lower barrier layer 206 and the bottom electrode 101 layers 101A, 101B to form rails which extend left to right in FIG. 6A (break between rails is in and out of the page in FIG. 6A). The mask pattern 602 is then removed, and an insulating fill layer is then formed between adjacent rails and planarized. The barrier 210 and top electrode 100 layers are then formed over the rails and the planarized insulating fill layer. Then, the barrier 210 and top electrode 100 layers are patterned by lithography and etching into rails which extend in an out of the page in FIG. 6B, while the underlying storage element 118, features 404A/fill layer portions 404B, nano-rail electrode 202 and the diode 110 rails are patterned into discreet pillars during the same etching step. The etch stops on the bottom barrier 206 rails.

FIGS. 7-8 illustrate a second embodiment method of making the memory device with the nano-rail electrode. This method is the same as the first embodiment method described above with respect to FIGS. 4-6, except that the anisotropic spacer etch is omitted. Thus, in the second embodiment, after forming the structure shown in FIG. 4B using the steps described above with respect to FIGS. 4A and 4B, the spacer etch of layer 402 is omitted. In the structure of FIG. 4B, the electrically conductive layer 402 is formed over an upper surface of the features 404A (e.g., over the mandrels), on sidewalls of the features 404A and between the features 404A, such that layer 402 is located on the exposed upper diode 110 surface (or on an upper surface of an optional barrier layer 208 overlying the diode shown in FIG. 2A).

Then, the sidewall spacer etch is omitted and the electrically conductive layer 402 is planarized by CMP or etchback such that layer 402 is removed from the upper surfaces of the features 404A, while horizontal portions 205 of layer 402 remain over the diode 110 between the features 404A, and vertical portions 202 of layer 402 remain on sidewalls of the first and the second features, as shown in FIG. 7A.

If desired, the insulating fill layer 404B may be formed over the layer 402 before the planarization step. In this case, layer 404B is planarized together with layer 402 such that the planarized insulating fill layer portions 404B remain adjacent to the exposed sides of the nano-rail electrodes 202 (i.e., the remaining vertical portions 202 of layer 402) and over the upper surface of the remaining horizontal portion 205 layer 402. Thus, the remaining connected vertical 202 and horizontal 205 portions of layer 402 form an electrically conductive "U" shape 202/205/202 (see e.g., FIGS. 9 and 10) which is exposed between the adjacent features 404A and which is filled with the remaining portion of layer 404B after the planarization.

Then, the method proceeds similar to the method described above with respect to FIGS. 5B, 6A and 6B. The storage element 118, the barrier layer 210 and the top electrode layer 100 are then formed over the planarized structure, as shown in FIG. 7B. The masking pattern 602 is then formed over the top electrode layer 100 as shown in FIG. 8A. Finally, as shown in FIG. 8B, the device is patterned into rails and/or pillars similar to that described above with respect to FIG. 6B. This results in the nano-rail electrodes 202 having the horizontal portions 205 as shown in FIGS. 2B and 8B.

Figure 9:
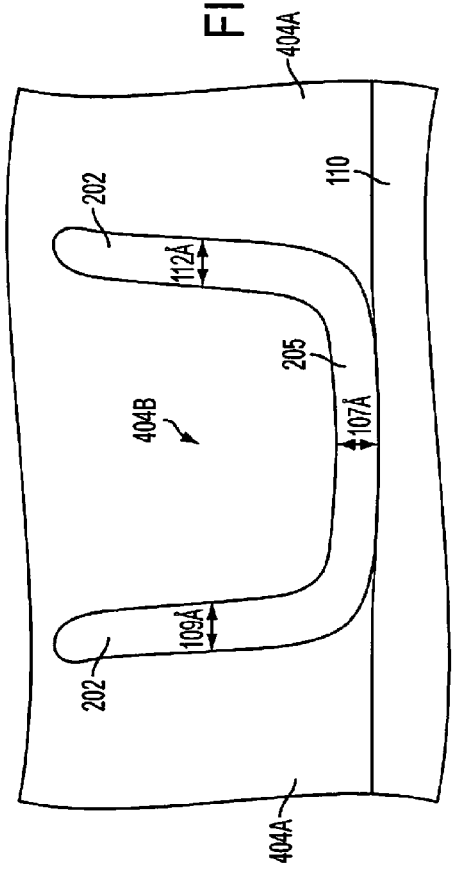
FIGS. 9 and 10 are micrographs illustrating exemplary nano-rail electrodes.
Figure 10:
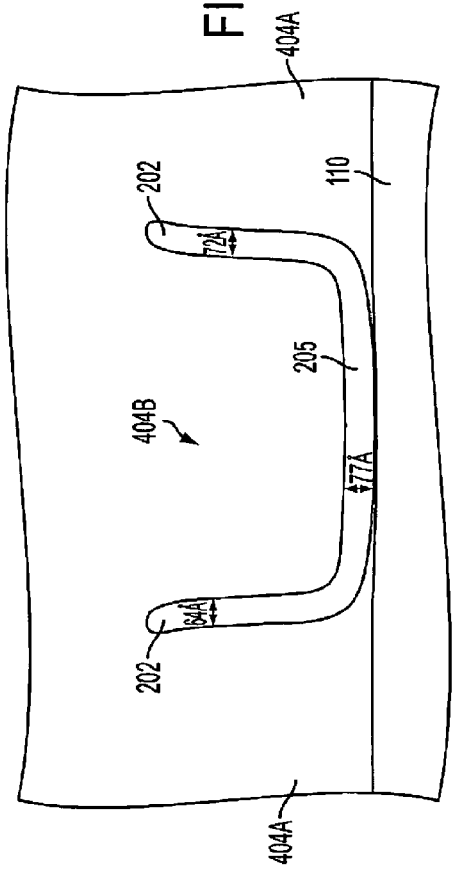

FIGS. 9 and 10 illustrate micrographs of the planarized layer 402 after the planarization step shown in FIG. 7A. As shown in FIG. 9, an about 11 nm thick polysilicon layer 402 forms an about 11 nm thick polysilicon nano-rail electrodes 202 on sidewalls of the adjacent features 404A and an about 11 nm thick polysilicon horizontal portion 205 between the features. In contrast, as shown in FIG. 10, a thinner, about 7 nm thick polysilicon layer 402 forms an about 7 nm thick polysilicon nano-rail electrodes 202 on sidewalls of the adjacent features 404A and an about 7 nm thick polysilicon horizontal portion 205 between the features.

FIGS. 11-15 illustrate embodiment methods of integrating the nano-rail electrode 202 into exemplary three dimensional non-volatile memory devices. It should be noted that the electrode 202 can be integrated into other memory devices and that the following embodiments are non-limiting on the scope of the invention.

FIGS. 11A through 11F illustrate three dimensional schematic drawings illustrating stages in formation of a device of a third embodiment.

Referring to FIG. 11A, a first device level includes first non-volatile memory rails 102 separated by first insulating features 612. The rails 102 extend in a first direction along Line 1. Rails 102 may include semiconductor rails located above or below switching material rails as will be described below with respect to FIGS. 3A-3F and 4 A-4B. In some embodiments, the rails 102 are located over first conductive rails 512 which extend in the first direction.

A second conductive layer 521 can then be formed over the first device level, followed by forming a seed layer 291, such as a semiconductor seed layer, over the second conductive layer 521, a sacrificial layer 231 over the seed layer 291, and an optional hard mask layer 251 over the sacrificial layer 231.

A plurality of second rails 712 extending in a second direction along Line 2, as shown in FIG. 11B, can then be formed by patterning the optional hard mask layer 251, the sacrificial layer 231, the seed layer 291, the first conductive layer 521 and rails 102 and 612 in the first device level. As shown in FIG. 11B, the plurality of second rails 712 extend at least partially into the first device level and are separated from each other by rail shaped openings 822 which extend at least partially into the first device level. Thus, the etching extends through first and second levels to form rails in both levels. Each rail 712 comprises rail shaped portions 522, 292, 232, 252 of layers 521, 291, 231 and 251, as shown in FIG. 11B.

Turning to FIG. 11C, second insulating features 622 can then be formed between the plurality of second rails 712 in the openings 822. The optional hard mask layer 251 and sacrificial layer 231 can then be removed, to expose the seed material rails 292. A plurality of rail shaped openings 832 remain located between the second insulating features 622 (see FIG. 11D).

Next, the second semiconductor rails 282 are formed over the seed material rails 292 in the openings 832 between features 622. The second semiconductor rails 282 extend in the second direction between the second insulating features 622 and are located in the second device level over the first device level. In some embodiments, the seed material rails 292 and the second semiconductor rails 282 form second diode rails 212.

The step of selectively growing second semiconductor rails 282 may comprise selectively depositing the semiconductor rails 282 to partially fill the openings 832 between the second insulating features 622 to leave recesses 82 over the semiconductor rails 282, as shown in FIG. 11D. Alternatively, the step of selectively growing second semiconductor rails 282 may completely fill the openings first, followed by a step of recessing the second semiconductor rails 282 to form recesses 82, such as by selective etching of rails 282.

In an alternative embodiment, the semiconductor rails 282 can be formed by non-selective deposition. In this method, the semiconductor material fills the openings and is located over the tops of the second insulating features 622. The semiconductor material may then be planarized by an etchback or CMP such that it is level with tops of features 622. The semiconductor rails 282 (which can also be referred to as second diode rails 212 if seed rails 292 are omitted) can then be recessed to form rail shaped openings 82, as shown in FIG. 11D. In this embodiment, the seed layer 291 may be omitted where the second semiconductor rails 282 encompass the entire structure of rail shaped diodes (i.e., the second diode rails 212).

Figure 11E:
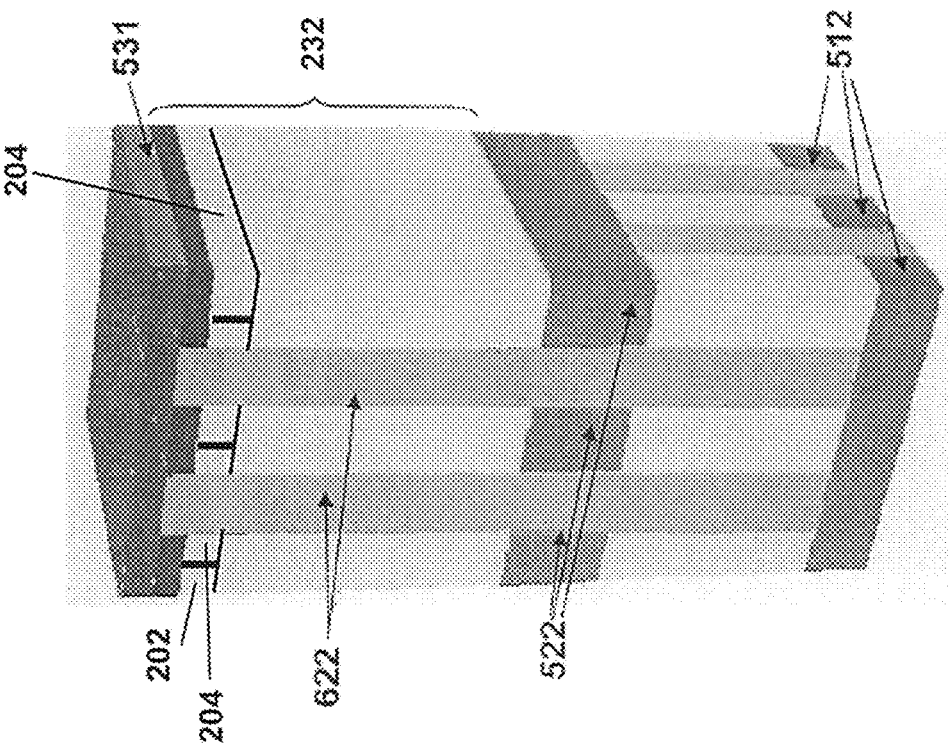

Next, as shown in FIG. 11E, the nano-rail electrode 202 and the insulating material 204 are formed over the second diode rails 212. The nano-rail electrode may be formed using any of the methods described above, such as by the sidewall spacer method illustrated in FIGS. 4A-6B or by the planarization method illustrated in FIGS. 7A-8B and as described above.

Alternatively, the nano-rail electrode 202 may be formed as a sidewall spacer on the sidewalls of second insulating features 622, as shown in FIG. 16A. In other words, rather than forming a separate mandrel 404A between the protruding portions of the second insulating features 622 and then forming layer 402 over the mandrel 404A, the mandrel 404A is omitted. Instead, the protruding portions of the second insulating features 622 act as the mandrels 404A and the layer 402 is formed over the second insulating features 622. Layer 402 is then subjected to a sidewall spacer etch as shown in FIG. 5A or to a planarization as shown in FIG. 7A to form the nano-rail electrodes 202 on the sidewalls of the protruding portions of the second insulating features 622. The insulating fill layer 404B may be formed adjacent to the exposed sidewalls of the electrodes 202 as shown in FIG. 5A or 7A.

In this configuration, the nano-rail electrodes 202 are located in contact with the sidewall of the protruding portions of the second insulating features 622 as shown in FIG. 16A. If desired, the electrodes 202 and insulating material 204 may be over planarized or further etched back to be recessed slightly below the top of the top surface of the second insulating features 622 to allow the switching material 222 (e.g., storage element 118) to be formed between the second insulating features 622 rather than over the top of the second insulating features 622, as shown in FIG. 16A.

Figure 11F:
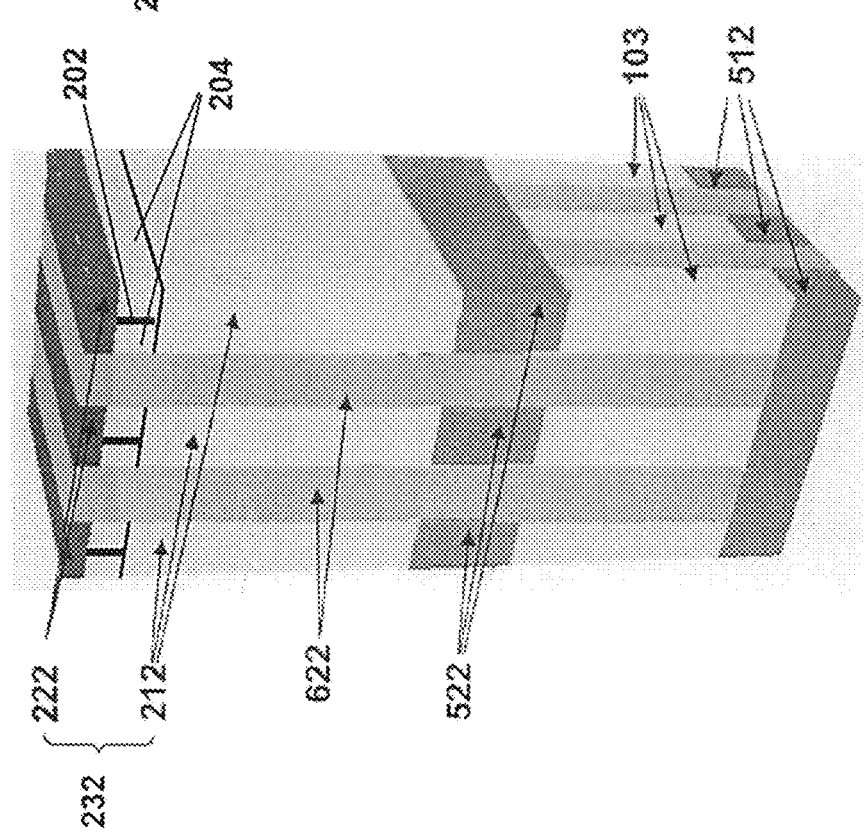

Next, the switching material 222 can then be formed in the rail shaped openings or recesses 82 over the nano-rail electrodes 202 and insulating material 204 located over the diode rails 212, resulting in a structure shown in FIGS. 11E and 16A. Material 222 may be optionally planarized with tops of features 622. In some embodiments, the switching material rails 222, the nano-rail electrodes 202 and the second diode rails 212 form second non-volatile memory rails 232. Further, a third conductive layer 531 can be formed over the second non-volatile memory rails 232 and the second insulating features or rails 622, as shown in FIGS. 11F and 16B.

Figure 11G:
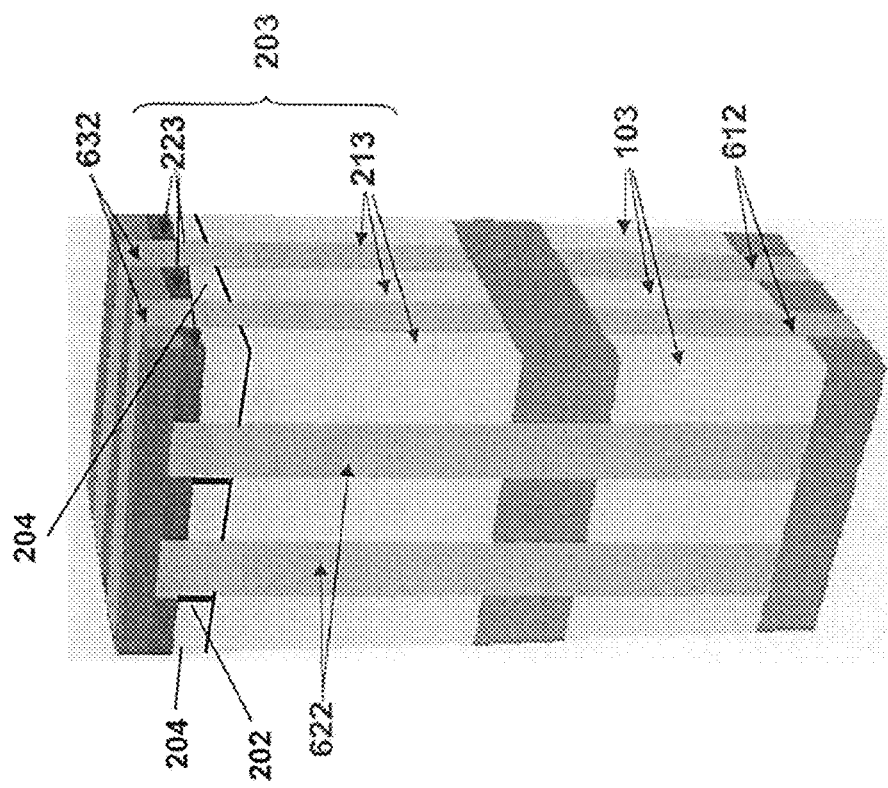
Figure 16C:
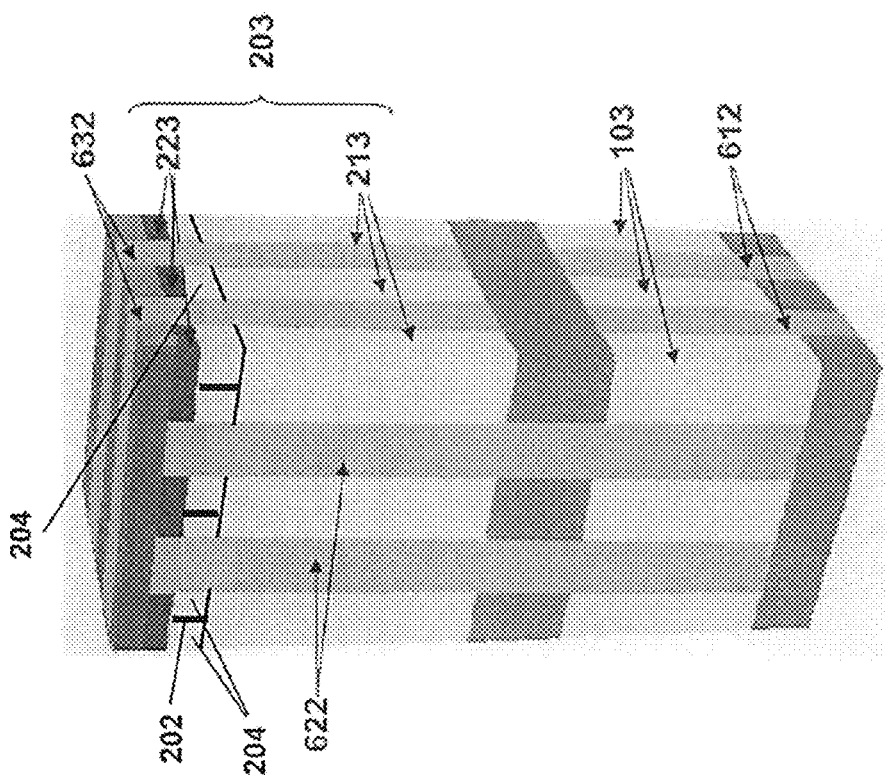

Turning to FIGS. 11G and 16C, the second non-volatile memory rails 232, the second insulating features 622 located between the second non-volatile memory rails 232 and the third conductive layer 531 can then be patterned to form a plurality of third rails extending in the first direction separated from each other by rail shaped openings. This is followed by forming third insulating features 632 between the plurality of third rails to form second pillar-shaped non-volatile memory cells 203 separated by insulating material of the second 622 and third 632 insulating features. Remaining rail shaped portions of layer 531 separated by features 632 form upper rail shaped electrodes.

Thus, the method of the third embodiment provides a device level comprising a plurality of rails 232, wherein each rail 232 comprises a conductor rail 522, a semiconductor rail 212 located over the conductor rail 522, and a nano-rail electrode 202 having a width of 15 nm or less. The rails 232 are separated by insulating features 622 and the rails 232 extend in a first direction. Another conductor layer 531 is formed over this device level. The conductor layer 531, the nano-rail electrode 202 and the semiconductor rails 212 in the rails 232 are patterned to form a plurality of additional rails 203 (e.g., the rails which contain pillar shaped memory cells 203) extending in a second direction different from the first direction. The patterning partitions the conductor layer 531 into a plurality of conductor rails located in the rails 203 extending in the second direction. The patterning also partitions the semiconductor rails 212 into a plurality of semiconductor pillars 213 which have a rectangular cross section when viewed from above. Finally, insulating features 632 are formed between the rails which contain memory cells 203. The top and bottom of each semiconductor pillar 213 (which also contains the electrode 202, insulating material 204 and switching material 222 at its top portion) electrically contacts the respective conductor rails 522, 531. The pillar is surrounded by insulating features on of its four sides, such that the insulating features 622, 632 are located adjacent to a respective sidewall of the pillar 213.

Alternatively, the rail patterning of the memory cells 203 may be completed after depositing several layers of the third device. In the above explained embodiments, each of the second pillar-shaped non-volatile memory cells 203 comprises a diode 213, the electrode 202, and a switching material 223 located above the diode. The pillar shaped cells 203 have a square or rectangular cross section.

Figure 12:
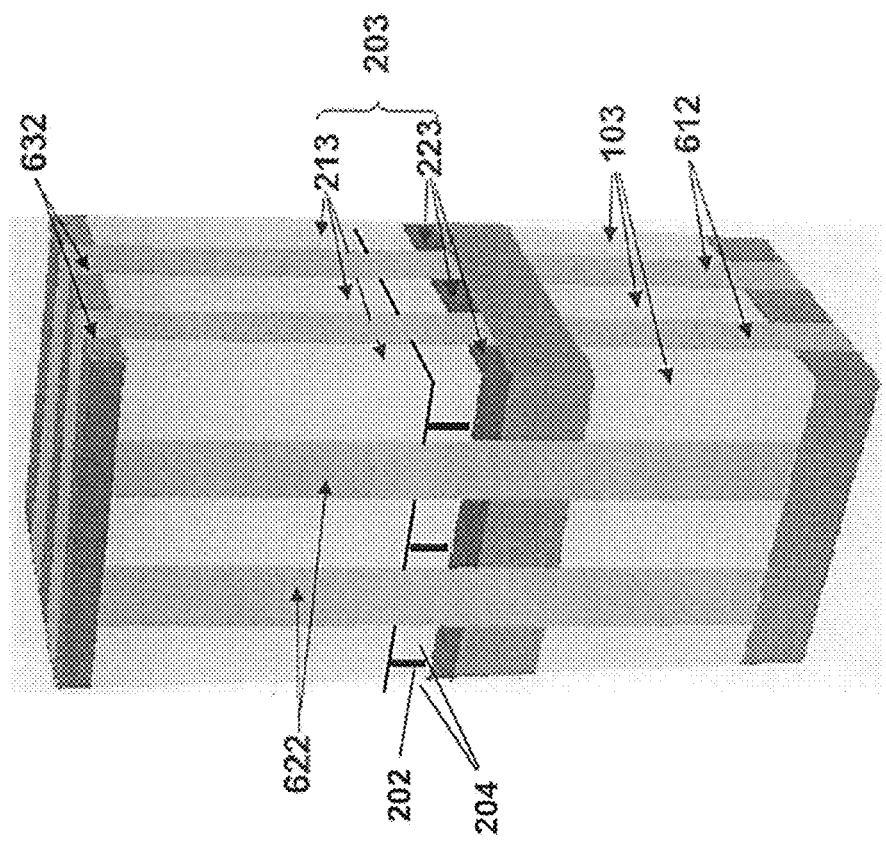
FIG. 12 is a 3D schematic drawing illustrating the structure of a device formed according to an alternative embodiment.

In some alternative embodiments, the switching material 223 may be located below the diode 213, as shown in FIG. 12. In these alternative embodiments, the switching material may be formed between the second conductive layer 522 and the optional seed layer 291. The second diode rails may be either selectively or non-selectively deposited in the openings formed by removing the sacrificial features to form the second non-volatile memory rails comprising switching material rails located below the second diode rails. After patterning the second non-volatile memory rails and the second insulating features located between the second non-volatile memory rails to form a plurality of third rails and forming the third insulating features 632 between the plurality of third rails, the resulting structure shown in FIG. 12 is formed. Thus, as shown in FIGS. 11G and 12, pillar shaped non-volatile memory cells 103, 203 are formed in the first and second device levels, respectively. Conductive rails 512, 522 act as bottom and top electrodes of cells 103, while rails 522, 532 act as bottom and top electrodes of cells 203.

The first device level (e.g., the lower portion of the structure shown in FIG. 11A) may be formed by any suitable methods. For example, the first device level may be formed by forming a stack of device layers, patterning the stack of device layers to form rails, and forming insulating features between the rails. Alternatively, the first device level may also be formed by damascene method. A non-limiting example is illustrated in FIGS. 13A through 13F, which are side cross-sectional view illustrating stages in formation of the first device level.

Referring to FIG. 13A, a first conductive layer 511 can be formed over a substrate 100, followed by forming a seed layer 191 over the first conductive layer 511 and a sacrificial layer 131 over the seed layer 191.

Next, a plurality of sacrificial material rails 132, seed material rails 192, and first conductive rails 512 can be formed by etching the stack of the layers 511, 191, 131, resulting in rails 721 separated by rail shaped openings 842 in FIG. 13B. The etching may be performed using rail shaped photoresist mask (not shown). First rail shaped insulating features 612 can be formed between the plurality of rails 721 (which include sacrificial material rails 132), in openings 842 as shown in FIG. 13C.

The sacrificial material rails 132 can then be removed such as by ashing or selective etching, forming openings 812 over the seed material rails 192, as shown in FIG. 13D. The first semiconductor rails 182 can be then selectively deposited over the seed material rails 192 between the first insulating features 612. In some embodiments, the first semiconductor rails 182 and the seed material rails 192 form the first diode rails 112. Furthermore, the first semiconductor rails 182 can then be recessed by selective etching to form rail shaped openings 81 over the first diode rails 112, resulting in a structure shown in FIG. 13E. Alternatively, the step of selectively depositing the first semiconductor rails 182 may partially fill the openings 812 to form recesses (i.e., rail shaped openings 81) over the first semiconductor rails 182 in one deposition step.

In another embodiment, the first semiconductor rails 182 may be formed by non-selective deposition methods. In this embodiment, the seed material layer 191 may be omitted, and the first semiconductor rails 182 encompass the entire structure of rail shaped diodes (i.e., the first diode rails 112).

Turning to FIG. 13F, switching material rails 122 can then be formed over the first diode rails 112 in the recesses 81, resulting in a structure shown in FIG. 13F. Rails 122 may be planarized with tops of features 612. The switching material rails 122 and the first diode rails 112 form structures of non-volatile memory rails 102.

Figure 14B:
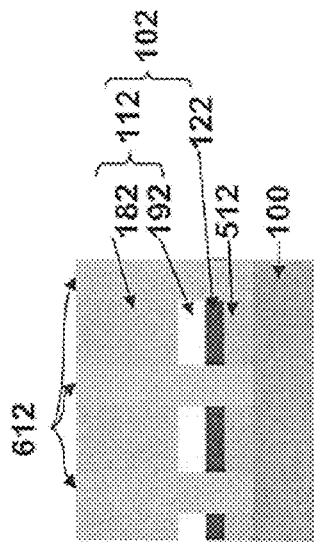
FIGS. 14A to 14B are side cross-sectional views illustrating stages in formation of the first device level according to an alternative embodiment.
Figure 14A:
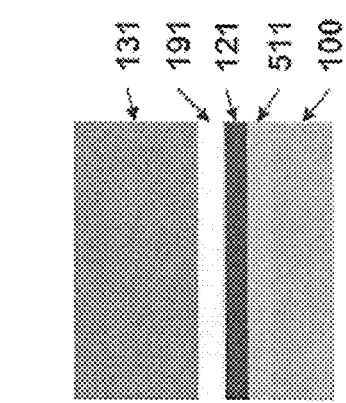

In the above explained embodiments, the switching material rails 122 are located above the first diode rails 112. Alternatively, the switching material rails 122 may be formed below the first diode rails 112. In these alternative embodiments, as shown in FIG. 14A, a switching material layer 121 may be formed between the first conductive layer 511 and the optional seed layer 191 or sacrificial layer 131 if layer 191 is omitted. After the sacrificial layer 131 and optional layer 191 patterning similar to that shown in FIG. 13B, insulating feature 612 formation similar to that shown in FIG. 13B, and sacrificial feature 131 removal similar to that shown in FIG. 13D, the first diode rails 212 may be either selectively or non-selectively deposited in the openings formed by removing the sacrificial features. The resulting first non-volatile memory rails 102 comprise switching material rails 122 located below the first diode rails 112, as shown in FIG. 14B.

Figure 15B:
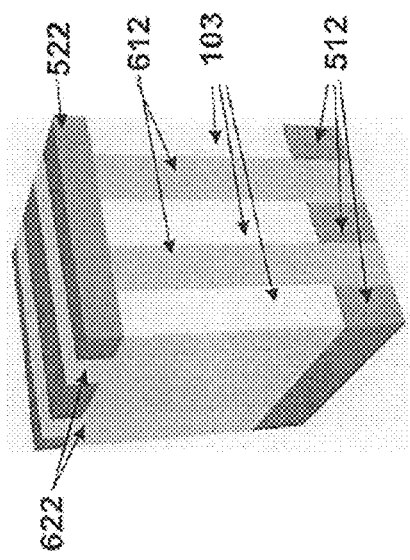
FIG. 15B is a 3D schematic drawing illustrating a structure of a device formed according to an alternative embodiment.
Figure 15A:
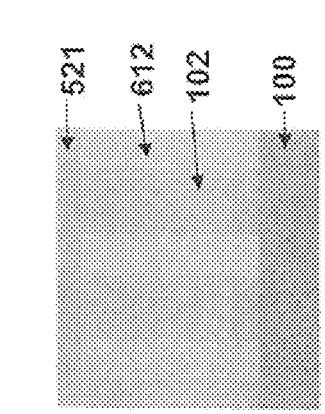
FIG. 15A is a side cross-sectional view illustrating a stage in formation of a device.

Next, as described above, the second conductive layer 521 can then be formed over the first device level, resulting in a structure shown in FIG. 15A. The second conductive layer 521 is then deposited over the rails 122. This structure corresponds to the lower portion of the 3D structure shown in FIG. 11A. Then, as shown in FIGS. 11B-11G, 12 and 16A-16C the first non-volatile memory rails 102 are patterned to form a plurality of first non-volatile memory cells 103 in the first device level. Each cell 103 includes a pillar shaped diode steering element and a pillar shaped storage element above or below the diode.

In an alternative embodiment, rather than using the steps explained in the embodiment illustrated in FIG. 11A-11G, 12 or 16A-16C the first non-volatile memory rails 102, the first insulating features 612 and conductive layer 521 may be patterned to form a plurality of second rails, between which second insulating features 622 are formed, resulting in a structure shown in FIG. 15B. Each of the resulting pillar shaped first non-volatile memory cells 103 comprises a diode steering element and a storage element of the switching material located above or below the diode steering element. The first non-volatile memory cells 103 are separated by insulating material of the first 612 and 622 insulating rails. The second conductive rails 522 extend in the second direction different from that of the first conductive rails 512. Rails 512 and 522 form the lower and upper electrodes, respectively, of each cell 103.

Thus, as shown in the alternative method of FIG. 15B, the step of forming rails in two device levels using the same etching step shown in FIG. 11B is omitted. Instead, the pillar shaped devices are formed by etching only the layers or rails in the first device level.

In a fourth embodiment, the sacrificial layer(s) are omitted and the semiconductor layer(s), nano-rail electrode conductive layer 402, switching material layer and the top and bottom conductor layers are deposited over the substrate. At least the bottom conductor layer, the switching material layer, the nano-rail electrode conductive layer and the semiconductor layer(s) are patterned into rails, and then the space between the rails is filled with an insulating fill material. These rails are then patterned into pillars in a subsequent patterning step, during the which the upper conductor is patterned into rails. The space between the pillars is then filled with additional insulating fill material.

For example, the method of the fourth embodiment may be used to form rails in a single device level only, as shown in FIGS. 17A-17C. As shown in FIG. 17A, a semiconductor layer 110 (e.g., the p-i-n sublayers of the diode 110) are formed over the top planar surface of the bottom conductor rails 522 separated by insulating fill features 622 shown in FIG. 15B. Alternatively, layer 110 may be formed over the substrate 400.

The nano-rail electrodes 202, the insulating material 204 and the switching material layer/storage element 118 are then formed over the semiconductor layer 110 using the method shown in FIG. 4A-6B or 7A-8B. The nano-rail electrodes 202, the insulating material 204, the switching material layer/storage element 118 and the semiconductor layer 110 are then patterned by lithography and etching into rails 922 which extend in the same direction as the bottom conductor rails 522, as shown in FIG. 17B. An insulating fill layer 642 is then formed between the rails 522 by non-selective deposition and planarization or by selective deposition.

An upper conductor layer 531 is then deposited over the top planar surface of the insulating fill layer 642 and the storage element 118. The upper conductor layer 531, storage element 118, the nano-rail electrodes 202, the insulating material 204, and the semiconductor layer 110 are then patterned by lithography and etching into rails 952 which extend in a different (e.g., perpendicular) direction from rails 922, as shown in FIG. 17C. Finally, the second insulating fill layer 962 is then formed between the rails 952 by non-selective deposition and planarization or by selective deposition, as also shown in FIG. 17C. This forms pillar memory cells 913 containing the semiconductor diode 110, the nano-rail electrode 202 (with or without optional horizontal portion 212), the insulating material 204 and the storage element 118 between lower rail shaped electrodes 522/101 and orthogonal upper rail shaped electrodes 531/100. Additional device levels may be formed over this device level by repeating the steps of FIGS. 17A-17C described above.

The method of the fourth embodiment may also be used to pattern rails in plural device levels during the same lithography and etching step. For example, a semiconductor layer may be patterned together with second conductor layer, the nano-rail electrode layer 402 and the semiconductor rails 212/282 in the underlying device level to form the multi-level rails. These multi-level rails comprise the semiconductor pillars 213, the nano-rail electrode 202, the insulating material 204, the switching material 222, top conductor rails 532, and upper semiconductor rails, as well as a portion of the bottom conductor rails 522 which extend in a different direction from the multi-level rails. The insulating fill features 642 are then formed between the multi-level rails and extend between the semiconductor pillars 213, the conductor rails 532, the nano-rail electrode 202, the switching material 222 and the upper semiconductor rails.

A top conductor layer is then formed over the multi-level rails and the insulating fill features 642. The top conductor layer, the nano-rail electrode 202 and the upper semiconductor rails are patterned to form a plurality of upper level rails extending in the first direction, such that the upper semiconductor rails are partitioned into upper semiconductor pillars containing the nano-rail electrode and the resistivity switching material in the top of the pillar, and the upper conductor layer is partitioned into upper conductor rails. Finally, upper insulating fill features are formed between the upper level rails.

Additional levels may then be formed using similar techniques as those described above. For example, the device may comprise 4-8 levels, where the rail shaped electrodes in each level extend in the same direction and the electrodes in adjacent levels extend in perpendicular directions. In other words, the electrodes in all even numbered levels preferably extend in one first direction, while the electrodes all odd numbered levels extend in a perpendicular second direction. Each device level includes pillar shaped memory cells between lower and upper electrodes.

The conductive material of the conductive rails 512, 522 and 532 can independently comprise any one or more suitable conducting material known in the art, such as tungsten, copper, aluminum, tantalum, titanium, cobalt, titanium nitride or alloys thereof. For example, in some embodiments, tungsten is preferred to allow processing under a relatively high temperature. In some other embodiments, copper or aluminum is a preferred material.

The insulating material of the features 612, 622, 632, 642 and 962 can be any electrically insulating material, such as silicon oxide, silicon nitride, silicon oxynitride, or other high-k insulating materials. The sacrificial materials 131 and 231 may comprise any suitable sacrificial materials, including organic hard mask material such as amorphous carbon or silicon nitride material. For example, the sacrificial material may be amorphous carbon and the hard mask material may be silicon nitride. The sacrificial material should have etching characteristics different from that of the insulating features 612 and/or 622 to allow selective etching or ashing.

Any suitable semiconductor materials can be used for features 110 and 213, for example silicon, germanium, silicon germanium, or other compound semiconductor materials, such as III-V, II-VI, etc. materials. As explained above, the semiconductor material may be formed by any suitable selective or non-selective deposition methods. In one embodiment, the semiconductor material in at least one of the first and second device levels is selectively deposited by low pressure chemical vapor deposition (LPCVD). For example, the method described in U.S. application Ser. No. 12/216,924 filed on Jul. 11, 2008 or U.S. application Ser. No. 12/007,781 (published as US Published Application 2009/0179310 A1), incorporated herein by reference in their entirety, may be used to deposit polysilicon. Alternatively, the methods described in U.S. application Ser. No. 11/159,031 filed on Jun. 22, 2005 (which published as US Published Application 2006/0292301 A 1) and in U.S. application Ser. No. 12/007,780 filed on Jan. 15, 2008, incorporated herein by reference in their entirety, may be used to deposit the germanium. The semiconductor material may be amorphous, polycrystalline or single crystal. For example, the material may comprise polysilicon. The optional seed layer material may comprise any suitable semiconductor or silicide seed material which allows selective growth of the semiconductor materials of the features 213. For example, the seed layer may comprise polysilicon to grow additional polysilicon of the features 213.

The non-volatile memory cells 103 and 203 may be one-time programmable (OTP) or re-writable. For example, each pillar diode 110 may act as a steering element of a memory cell, while a switching material may act as a storage element 118 (i.e., which stores the data by changing its resistivity state, etc.) provided in series with the steering element. The diodes may have a bottom heavily doped n-type region, an optional intrinsic region (a region which is not intentionally doped), and a top heavily doped p-type region. The orientation of the diodes may be reversed. The diodes may be formed by depositing intrinsic semiconductor material on the n-type or p-type material followed by implanting the other one of the n-type or p-type dopants into the upper portion of the diodes. Alternatively, the upper regions of the p-i-n diodes may be formed by depositing a doped semiconductor material on the intrinsic semiconductor material.

The switching material can be one of antifuse, fuse, metal oxide memory, switchable complex metal oxide, carbon nanotube memory, graphene resistivity switchable material, carbon resistivity switchable material, phase change material memory, conductive bridge element, or switchable polymer memory. The antifuse dielectric layer can be one of hafnium oxide, aluminum oxide, titanium oxide, lanthanum oxide, tantalum oxide, ruthenium oxide, zirconium silicon oxide, aluminum silicon oxide, hafnium silicon oxide, hafnium aluminum oxide, hafnium silicon oxynitride, zirconium silicon aluminum oxide, hafnium aluminum silicon oxide, hafnium aluminum silicon oxynitride, zirconium silicon aluminum oxynitride, silicon oxide, silicon nitride, or a combination thereof.

The methods of forming one, two or three device levels have been explained above. Additional memory levels can be formed above or below the first, second or third memory levels described above to form a monolithic three dimensional memory array having more than two or more than three device levels.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits and fabrication steps are not specifically described, such circuits and protocols are well known, and no particular advantage is afforded by specific variations of such steps in the context of practicing this invention. Moreover, it is believed that one of ordinary skill in the art, equipped with the teaching of this disclosure, will be able to carry out the invention without undue experimentation.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention.

What is claimed is:

1. A non-volatile memory device comprising a plurality of non-volatile memory cells, wherein each of the non-volatile memory cells comprises:
   a first electrode;
   a diode steering element;
   a storage element located in series with the diode steering element;
   a second electrode; and
   a nano-rail electrode having a width of 15 nm or less.

2. The device of claim 1, wherein:
   each of the non-volatile memory cells comprises a pillar shaped memory cell located over a substrate;
   the storage element is located above or below the diode; and
   the storage element and the diode are located between the first and the second electrodes.

3. The device of claim 2, wherein the nano-rail electrode is located in the pillar shaped memory cell between the storage element and the diode.

4. The device of claim 3, wherein:
   the storage element is located above the diode;
   a bottom of the nano-rail electrode is located in electrical contact with an upper surface of the diode;
   a top of the nano-rail electrode is located in electrical contact with a lower surface of the storage element;
   the first electrode is located in electrical contact with a lower surface of the diode; and
   the second electrode is located in electrical contact with an upper surface of the storage element.

5. The device of claim 4, further comprising an insulating material located adjacent to first and second sides of the nano-rail electrode between the lower surface of the storage element and the upper surface of the diode.

6. The device of claim 2, wherein the nano-rail electrode is located in the memory cell between one of the first or the second electrode and one of the storage element or the diode, such that the nano-rail electrode provides an electrical connection between the one of the first or the second electrode and the one of the storage element or the diode.

7. The device of claim 1, wherein the nano-rail electrode has a width of 2-15 nm, a height of 10-100 nm and length of 10-100 nm, and wherein the width is smaller than the length.

8. The device of claim 7, wherein:
   the nano-rail electrode comprises an electrically conductive material selected from polysilicon, metal or metal alloy which acts as a series resistor which reduces a current in the memory cell;
   the diode comprises a p-i-n diode;
   the storage element comprises at least one of switchable metal oxide, complex metal oxide layer, carbon nanotube material, graphene resistivity switchable material, carbon resistivity switchable material, phase change material, conductive bridge element, or switchable polymer material;
   the memory cell is a rewritable memory cell; and
   the memory device comprises a monolithic three dimensional array of the memory cells.

9. The device of claim 5, wherein:
   the first and the second electrodes comprise conductor rails;
   each pillar shaped memory cell has a rectangular cross section when viewed from above;
   the insulating material is located adjacent to opposing first and second sides of the memory cell, and extends between adjacent first electrode conductor rails; and
   the insulating material is also located adjacent to opposing third and fourth sides of the memory cell, and extends between adjacent second electrode conductor rails.

* * * * *